US009714999B1

(12) United States Patent
Nakai et al.

(10) Patent No.: US 9,714,999 B1
(45) Date of Patent: Jul. 25, 2017

(54) MAGNETIC RESONANCE IMAGING APPARATUS, TIME-SERIES IMAGE GENERATION METHOD, AND PROGRAM

(71) Applicant: HITACHI, LTD., Tokyo (JP)

(72) Inventors: Norimasa Nakai, Tokyo (JP); Hiroyuki Itagaki, Tokyo (JP)

(73) Assignee: HITACHI, LTD., Tokyo (JP)

(*) Notice: Subject to any disclaimer, the term of this patent is extended or adjusted under 35 U.S.C. 154(b) by 0 days.

(21) Appl. No.: 14/993,639

(22) Filed: Jan. 12, 2016

(30) Foreign Application Priority Data

Jan. 4, 2016 (JP) .................. 2016-000049

(51) Int. Cl.
| | | |
|---|---|---|
| G01V 3/00 | (2006.01) |
| G01R 33/565 | (2006.01) |
| G01R 33/561 | (2006.01) |
| G01R 33/44 | (2006.01) |
| G01R 33/48 | (2006.01) |

(52) U.S. Cl.
CPC ..... *G01R 33/56572* (2013.01); *G01R 33/443* (2013.01); *G01R 33/4828* (2013.01); *G01R 33/561* (2013.01)

(58) Field of Classification Search
CPC .............................. G01R 33/56572
USPC ....................... 324/309, 307, 314
See application file for complete search history.

(56) References Cited

U.S. PATENT DOCUMENTS

| 9,430,854 B2* | 8/2016 | Samsonov ............ G06T 11/005 |
| 2016/0131732 A1* | 5/2016 | Pfeuffer ............ G01R 33/56563 |
| | | 324/322 |
| 2016/0349343 A1* | 12/2016 | Zeller ................ G01R 33/5608 |

FOREIGN PATENT DOCUMENTS

| JP | 2002-200056 | 7/2002 |
| JP | 2012-90867 | 5/2012 |
| JP | 2013-183967 | 9/2013 |
| JP | 2015-503432 | 2/2015 |
| WO | 2013/157299 A1 | 10/2013 |

OTHER PUBLICATIONS

Apr. 5, 2016 Japanese official action (including English translation) in connection with corresponding Japanese patent application No. 2016-000049.
Jun. 28, 2016 Decision to Grant a Patent (including English translation) in connection with corresponding Japanese patent application No. 2016-000049.

* cited by examiner

*Primary Examiner* — Louis Arana
(74) *Attorney, Agent, or Firm* — Cooper & Dunham LLP

(57) ABSTRACT

To acquire a more accurate tissue contrast image such as a water-fat separation image in time-series imaging by an MRI apparatus, a static magnetic field non-uniformity map is created from a plurality of echo signals having different TEs obtained in time series, and a water-fat separation image is obtained using the static magnetic field non-uniformity map. Processing (spatial direction discontinuity correction processing) for correcting discontinuity of a phase or a frequency in a spatial direction and processing (time-series direction discontinuity correction processing) for correcting discontinuity in a time-series direction are performed for the static magnetic field non-uniformity map.

15 Claims, 17 Drawing Sheets

FIG.14

DYNAMIC IMAGING PARAMETERS

| 4D Unwrapping | ON |
|---|---|
| Start number | 2 |
| End number | 4 |

| Series matching | ON |
|---|---|
| Standard number | 1 |
| Matching number | 4,5 |

MAGNETIC RESONANCE IMAGING APPARATUS, TIME-SERIES IMAGE GENERATION METHOD, AND PROGRAM

FIELD OF THE INVENTION

The present invention relates to a magnetic resonance imaging apparatus (hereinafter, referred to as an MRI apparatus), and in particular, to a technique for acquiring a water-fat separation image continuously in time series in an MRI apparatus.

BACKGROUND ART

Various imaging methods using an MRI apparatus are known. As one of the imaging methods, there is a technique (hereinafter, referred to as a water-fat separation technique) for acquiring an image, which is separated into an image in which water is visualized with high contrast (hereinafter, referred to as a water image) and an image in which fat is visualized with high contrast (hereinafter, referred to as a fat image), using a difference in the behavior of water protons and fat protons after the application of a high frequency magnetic field. As one water-fat separation technique, there is a Dixon method of performing water-fat separation by calculation of a plurality of images obtained from echo signals measured by changing the echo time (TE). According to the method of setting the TE, there are methods, such as a two-point Dixon method and a three-point Dixon method.

The Dixon method is an imaging method using a phase rotation difference between water protons and fat protons at each TE for acquiring an echo signal, and is susceptible to static magnetic field non-uniformity. For this reason, a phase rotation component due to static magnetic field non-uniformity (static magnetic field non-uniformity map) is calculated, and correction for eliminating the influence is performed using the static magnetic field non-uniformity map. Here, when calculating the static magnetic field non-uniformity map, phase unwrapping processing is performed in order to prevent water and fat from being replaced with each other.

The phase unwrapping processing is a process of expressing a spatial phase change as a value of a phase exceeding the range of $-\pi$ to $\pi$ (hereinafter, referred to as "causing phase wrap") by eliminating a discontinuous jump, which occurs because the phase exceeding the range of $-\pi$ to $\pi$ is expressed again in the range of $-\pi$ to $\pi$, so that the spatial phase change is continuous.

Such phase wrap may occur in the entire imaging. In a case in which the phase wrap occurs in the entire imaging, water and fat are totally replaced with each other. In order to reduce the replacement between water and fat in the entire imaging in the two-point Dixon method, Patent Literature 1 discloses a technique of performing true-false determination.

There is a predetermined relationship (phase=$2\pi\times$frequency$\times$time) between the phase and the frequency. Accordingly, a technique of separating water and fat from each other using a static magnetic field non-uniformity map that is expressed as the amount of frequency shift rather than the phase rotation component is also known (Patent Literature 2). Patent Literature 2 discloses that water and fat are separated from each other by performing an iterative calculation based on the least squares estimation using a magnetic field non-uniformity map (static magnetic field non-uniformity map of the frequency) and a signal model including water protons and fat protons in a three-point Dixon method or a multi-point Dixon method. Also in this method, the static magnetic field non-uniformity map calculated by the iterative calculation based on the least squares estimation may converge to a wrong local solution (this state is referred to as "causing a local convergence"). Accordingly, similar to the phase unwrapping processing, this problem is reduced by performing processing for connecting the solution of the static magnetic field non-uniformity map so as to be spatially continuous.

On the other hand, in the MRI apparatus, a method of administering a contrast agent, repeating imaging in time series, and monitoring how the contrast agent dyes has been put to practical use. The method of acquiring images continuously in this manner is known as dynamic imaging. Also in this dynamic imaging, there is a demand to separate water and fat from each other. Therefore, a method of acquiring a water image is used in which a signal from fat is separated using the Dixon method in combination with the dynamic imaging (Patent Literature 3).

CITATION LIST

Patent Literature

[PTL 1]
Unexamined Patent Publication No. 2014-90949
[PTL 2]
U.S. Pat. No. 7,176,683
[PTL 3]
Unexamined Patent Publication No. 2002-52005

SUMMARY OF THE INVENTION

Technical Problem

In the case of using the Dixon method in combination with the dynamic imaging, there is a problem that the static magnetic field non-uniformity map changes between imagings repeated in time series and as a result, the accuracy of an image showing the finally constructed tissue is reduced. The change in the static magnetic field non-uniformity map may partially occur, or may occur in the entire imaging. The cause of the change in the static magnetic field non-uniformity map will be described using the dynamic imaging of the liver as an example.

In the dynamic imaging of the liver, in order to suppress artifacts due to respiratory motion, imaging is performed in a state in which breathing is stopped. How the contrast agent dyes is monitored by repeating the stop of breathing and imaging several times. For this reason, breathing-stopped positions are shifted from each other between imagings, or the inflow state of the contrast agent is changed. Accordingly, the static magnetic field non-uniformity map is partially changed. Due to the partial change in the static magnetic field non-uniformity map, partial phase wrap may occur.

In addition, the time of about 15 minutes is required until the contrast agent dyes completely. In the case of performing imaging until the contrast agent dyes completely, offset occurs in the static magnetic field non-uniformity map due to the shift of the resonance frequency according to the temperature change from the start of imaging. Also in this case, phase wrap occurs between time series, and this phase wrap occurs in the entire imaging.

The phase wrap that occurs between the time-series images in the entire or partial imaging may not be able to be removed in the known spatial phase unwrapping processing. Even if the true-false determination processing disclosed in Patent Literature 1 is used, water and fat may be totally replaced with each other between time series due to incorrect determination. In addition, even if the method disclosed in Patent Literature 2 is used, local convergence occurs, and water and fat are replaced with each other similarly.

Solution to Problem

It is an object of the invention to obtain an image showing the state of tissue more accurately when acquiring time-series tissue contrast images by repeatedly performing imaging in time series in an MRI apparatus.

In order to solve the aforementioned problem, an MRI apparatus of the invention includes means configured to perform processing (time-series direction discontinuity correction processing) to correct discontinuity in a time-series direction in addition to processing (spatial direction discontinuity correction processing) to correct discontinuity of a phase or a frequency in a spatial direction due to phase wrap or local convergence when creating a static magnetic field non-uniformity map from a plurality of echo signals having different TEs obtained in time series. The MRI apparatus of the invention determines whether or not discontinuity correction processing in the time-series direction is required, and performs the discontinuity correction processing in the time-series direction in part or entirely when it is determined that the discontinuity correction processing in the time-series direction is required.

In addition, a time-series image creation method of the invention is a time-series image creation method of forming a plurality of types of tissue contrast images as time-series images by calculation between original images using a plurality of original images reconstructed from echo signals having different echo times that are acquired in respective time-series imagings by an MRI apparatus. The time-series image creation method includes: creating a static magnetic field non-uniformity map showing phase rotation or frequency shift due to static magnetic field non-uniformity, from the plurality of original images, for each of the time-series imagings; correcting discontinuity of a phase or a frequency in a spatial direction for the static magnetic field non-uniformity map obtained for each of the time-series imagings; comparing the magnitude of an offset of a phase or a frequency in a time-series direction with a predetermined threshold value for the static magnetic field non-uniformity map obtained for each of the time-series imagings; correcting discontinuity in the time-series direction when the offset in the time-series direction is within a predetermined threshold value range; and creating a plurality of types of tissue contrast images using the corrected static magnetic field non-uniformity map and the plurality of original images.

According to the invention, it is possible to acquire an image (tissue contrast image) showing the state of tissue more accurately in dynamic imaging.

BRIEF DESCRIPTION OF THE DRAWINGS

FIG. 5A shows time-series original images, FIG. 5B shows a static magnetic field non-uniformity map, FIG. 5C shows discontinuity correction processing in the spatial direction, and FIG. 5D shows discontinuity correction processing in the time-series direction.

FIG. 14 is a drawing showing an example of user interface in a third embodiment.

DETAILED DESCRIPTION OF THE INVENTION

Figure 1:
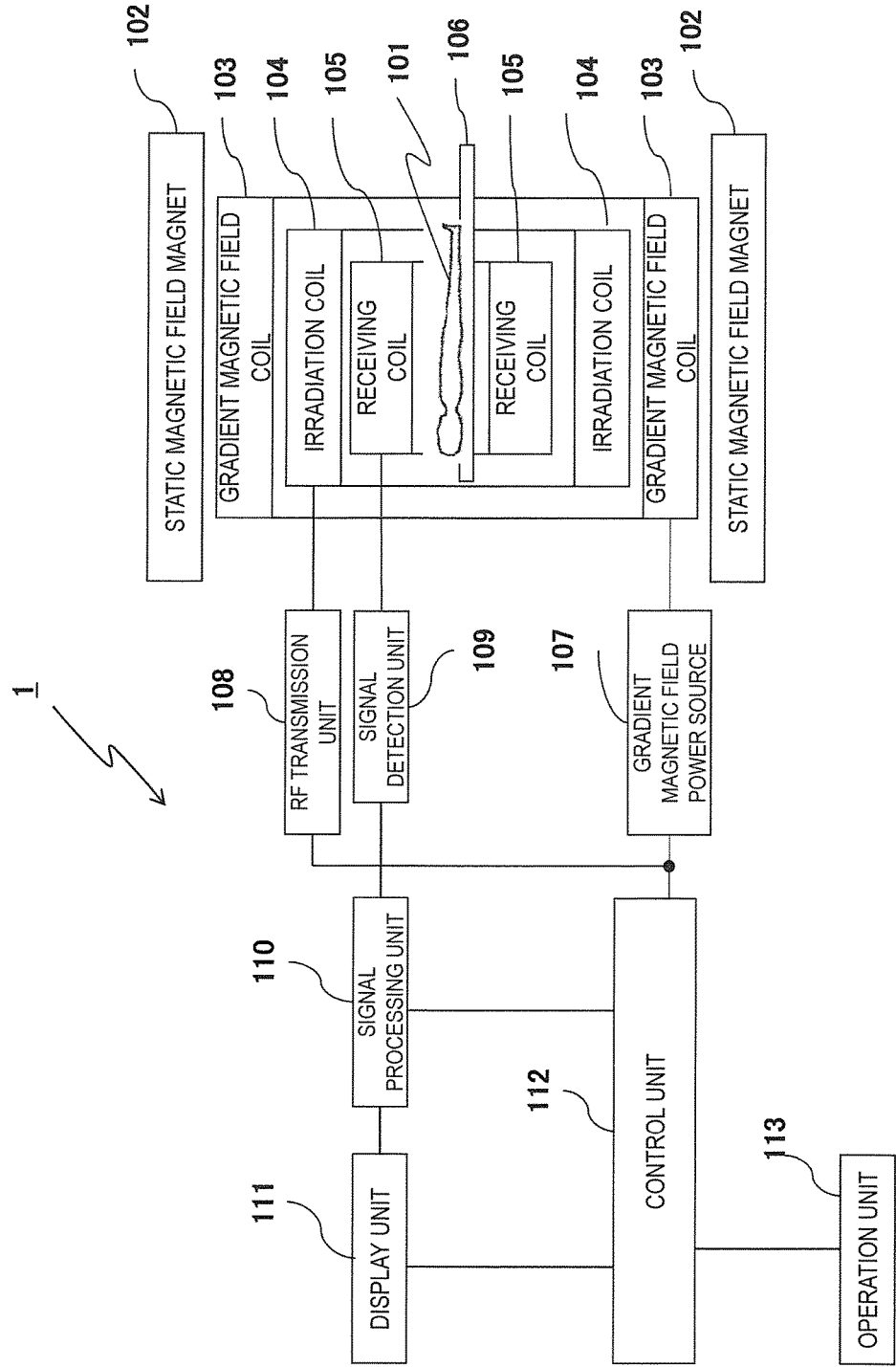
FIG. 1 is a configuration diagram showing an embodiment of an MRI apparatus.

Hereinafter, an embodiment of the invention will be described with reference to the accompanying diagrams. In addition, in all diagrams for explaining the embodiment of the invention, the same reference numerals are given to components having the same function, and the repeated explanation thereof will be omitted.

FIG. 1 is a diagram showing the overall configuration of an embodiment of an MRI apparatus 1 to which the invention is applied. As an imaging unit, the MRI apparatus 1 includes a static magnetic field generation magnet 102 for generating a static magnetic field, a gradient magnetic field coil 103 for generating a gradient magnetic field, an irradiation coil 104 for irradiating an object with a high frequency magnetic field pulse (hereinafter, referred to as an RF pulse), and a receiving coil 105 for detecting an NMR signal from the object, all of which are located around an object 101. In addition, the MRI apparatus 1 includes a bed 106 on which the object 101 is placed. The irradiation coil 104 is connected to an RF transmission unit 108, and the receiving coil 105 is connected to a signal detection unit 109. The gradient magnetic field coil 103 is connected to a gradient magnetic field power source 107.

In addition, MRI apparatus 1 includes a signal processing unit 110 for processing the NMR signal received by the receiving coil 105, a control unit 112 that controls the entire apparatus including the gradient magnetic field power source 107, the RF transmission unit 108, and the signal detection unit 109 of the imaging unit described above, a display unit 111 that displays an image, which is the processing result of the signal processing unit 110, or the like, and an operation unit 113 used when the operator sets imaging conditions or the like. The display unit 111 and the operation unit 113 may be disposed close to each other, so that the operator and the apparatus operate interactively therethrough.

The static magnetic field generation magnet 102 is disposed in a space having a predetermined spread around the object 101, is formed by a permanent magnet, a superconducting magnet, or a normal conducting magnet, and generates a uniform static magnetic field in a direction parallel or perpendicular to the body axis of the object 101.

The gradient magnetic field coil 103 applies gradient magnetic fields in three axial directions of X, Y, and Z axes to the object 101 based on the signal from the gradient magnetic field power source 107. The imaging section of the object is set according to the application direction of the gradient magnetic field.

The irradiation coil 104 generates an RF pulse according to the signal from the RF transmission unit 108. Nuclei of atoms forming the body tissue of the imaging section of the object 101 set by the gradient magnetic field coil 103 are excited by the RF pulse, and an NMR phenomenon is induced. Nuclei to be measured in a normal MRI apparatus are nuclei of hydrogen, that is, protons.

By the NMR phenomenon of the nuclei of atoms forming the body tissue of the object 101 induced by the RF pulse emitted from the irradiation coil 104, an echo signal that is an NMR signal is generated. The echo signal is detected by the signal detection unit 109 through the receiving coil 105 that is disposed close to the object 101. The detected echo signal is converted into an image after being subjected to the signal processing by the signal processing unit 110. The converted image is displayed on the display unit 111.

In order to repeatedly generate an RF pulse and each gradient magnetic field of slice encoding, phase encoding, or frequency encoding in a predetermined pulse sequence, the control unit 112 controls the gradient magnetic field power source 107 and the RF transmission unit 108, and controls the signal processing unit 110. Various pulse sequences that are different according to the imaging method are stored in the control unit 112 as a program in advance. The operator sets a predetermined pulse sequence and predetermined imaging parameters through the operation unit 113, and the pulse sequence is read and executed by the control unit 112.

As the pulse sequence, the MRI apparatus 1 of the present embodiment includes a pulse sequence of the Dixon method. In the Dixon method, a plurality of echo signals are acquired by changing the echo time (TE) until an echo signal is acquired from the application of the RF pulse by the irradiation coil 104. When the measurement target is a proton, each TE is selected such that the difference between the phase rotation of water protons and the phase rotation of fat protons after RF irradiation becomes a predetermined value. By repeating the pulse sequence, a set of echo signals (echo data) are collected for each of different echo times.

Examples of the Dixon method include a two-point Dixon method, a three-point Dixon, and a multi-point Dixon method according to the number of original images to be acquired or the method of setting the TE. In the present embodiment, any of these can be employed. Imaging is performed three times by changing the TE in the three-point Dixon method, and imaging is performed twice by changing the TE in the two-point Dixon method. In the three-point Dixon method, since imaging is performed three times by changing the TE, a longer time than in the two-point Dixon method is required, but a more accurate image than in the two-point Dixon method is obtained. In the multi-point Dixon method, imaging is performed three or more times by changing the TE. As the number of times of imaging increases, a longer time is required, but a more accurate image is obtained. Examples of the pulse sequence include a 2D pulse sequence to obtain two-dimensional data and a 3D pulse sequence to obtain three-dimensional data, and any of the 2D pulse sequence and the 3D pulse sequence may be used.

The control unit 112 acquires time-series echo data by performing imaging multiple times at predetermined intervals using the pulse sequence of the Dixon method. The imaging interval or the number of times of imaging differs depending on a target part or the purpose of imaging. The imaging interval or the number of times of imaging may be set in advance, or the operator may set the imaging interval or the number of times of imaging through the operation unit 113.

The signal processing unit 110 performs image reconstruction of echo data collected for each of different echo times by executing the pulse sequence of the Dixon method, thereby obtaining an image (referred to as an original image) for each echo time. By calculation between a plurality of original images, an image in which water protons are visualized with high contrast (hereinafter, referred to as a water image) and an image in which fat protons are visualized with high contrast (hereinafter, referred to as a fat image) are obtained. Hereinafter, a water image and a fat image are referred to collectively as a water-fat image. Using the echo signals collected for each of different echo times, the signal processing unit 110 creates phase rotation or frequency shift due to static magnetic field non-uniformity included in the echo signals as a static magnetic field non-uniformity map. The static magnetic field non-uniformity map is used in the calculation between a plurality of original images. The signal processing unit 110 performs these processes for each of a plurality of times of imaging performed in time series.

The static magnetic field non-uniformity map shows the amount of phase rotation or frequency shift for each pixel. Accordingly, which type of static magnetic field non-uniformity map is to be created is appropriately selected according to the subsequent method of calculation between original images.

In the static magnetic field generated in the space where the object 101 is placed by the static magnetic field generation magnet 102, spatial non-uniformity of a static magnetic field itself due to the magnet structure and spatial non-uniformity of a static magnetic field due to magnetic susceptibility being different for each part of the object placed in the static magnetic field space occur. Static magnetic field non-uniformity obtained in the static magnetic field non-uniformity map is a combination of both.

In addition, the signal processing unit 110 performs processing for correcting the discontinuity (phase wrap or local convergence) of the phase or frequency, which occurs in the created static magnetic field non-uniformity map. This processing is referred to as discontinuity correction processing. The signal processing unit 110 performs the discontinuity correction processing not only in the spatial direction but also in the time-series direction. The processing in the spatial direction is processing for detecting and correcting the phase wrap or local convergence between adjacent pixels for one static magnetic field non-uniformity map, and the processing in the time-series direction is processing for detecting and correcting the phase wrap or local convergence between the corresponding pixels (pixels having the same coordinates) for static magnetic field non-uniformity maps adjacent to each other in the time-series direction.

Figure 2:
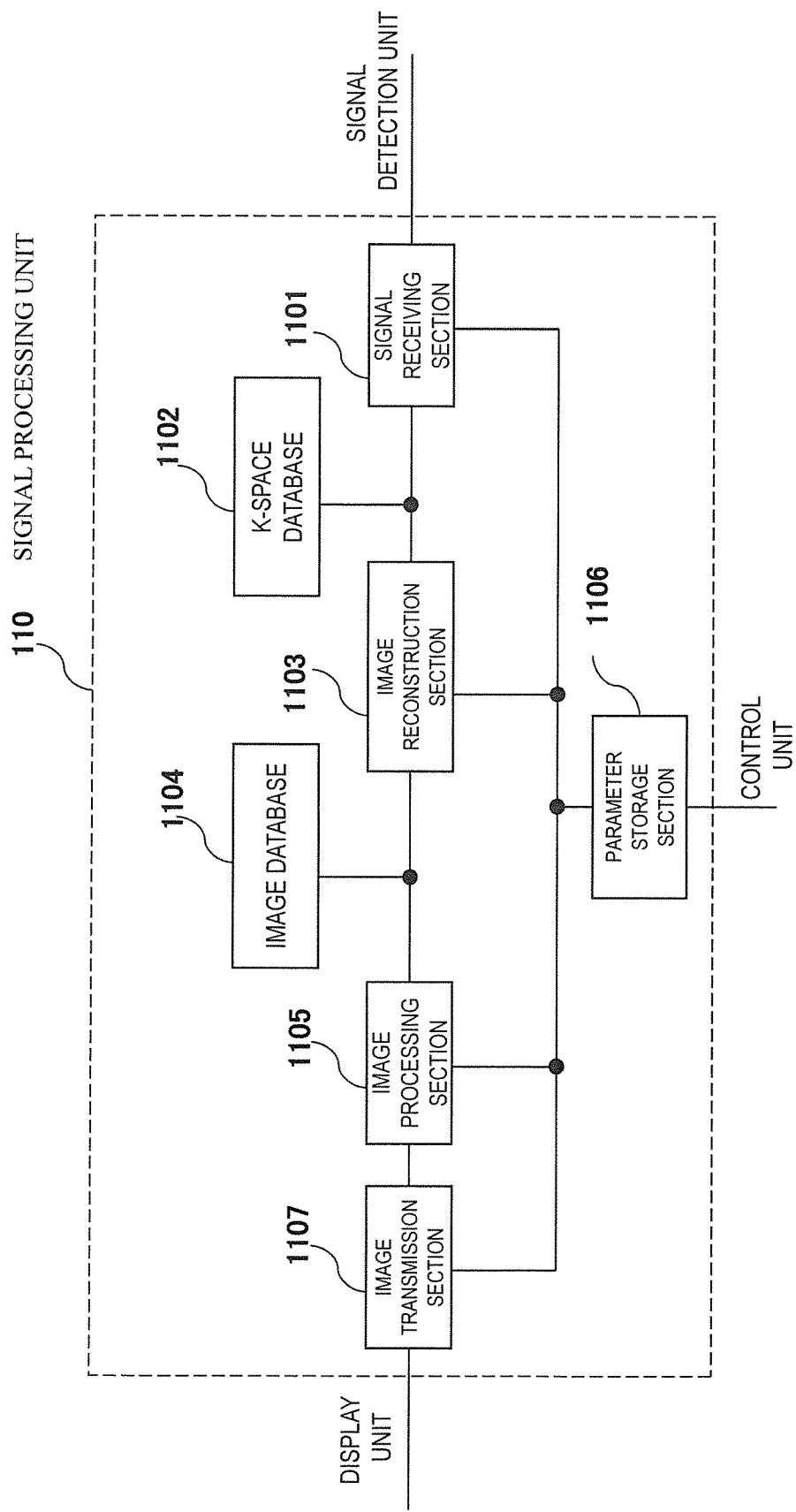
FIG. 2 is a functional block diagram of a signal processing unit.

The configuration of the signal processing unit 110 that performs the above processing will be described. FIG. 2 is a functional block diagram illustrating the processing function of the signal processing unit 110.

The signal processing unit 110 includes a signal receiving section 1101, an image reconstruction section 1103, an image processing section 1105, an image transmission section 1107, a k-space database 1102 as a memory, an image database 1104, and a parameter storage section 1106. The parameter storage section 1106 acquires information of the imaging number of slice encoding, frequency encoding, phase encoding, and dynamic imaging of the pulse sequence that the signal receiving section 1101 requires, parameters of an image matrix, filtering, and the like that the image reconstruction section 1103, the image processing section 1105, and the image transmission section 1107 require, and control information from the control unit 112, and stores these.

The signal receiving section 1101 stores the echo signal from the signal detection unit 109 in the k-space database 1102 based on the parameters stored in the parameter storage section 1106, for example, based on the information of arrangement to the k-space that includes the imaging number of slice encoding, frequency encoding, phase encoding, and dynamic imaging. The image reconstruction section 1103 converts the k-space data stored in the k-space database 1102 into an image by Fourier transform, and stores the image in the image database 1104. The image processing section 1105 performs image processing on the image stored in the image database 1104, and transmits it to the image transmission section 1107. Examples of the image processing include processing for creating a water image and a fat image and processing for correcting the unevenness of the sensitivity of the receiving coil 105. The image transmission section 1107 transmits the image-processed image to the display unit 111.

Figure 3:
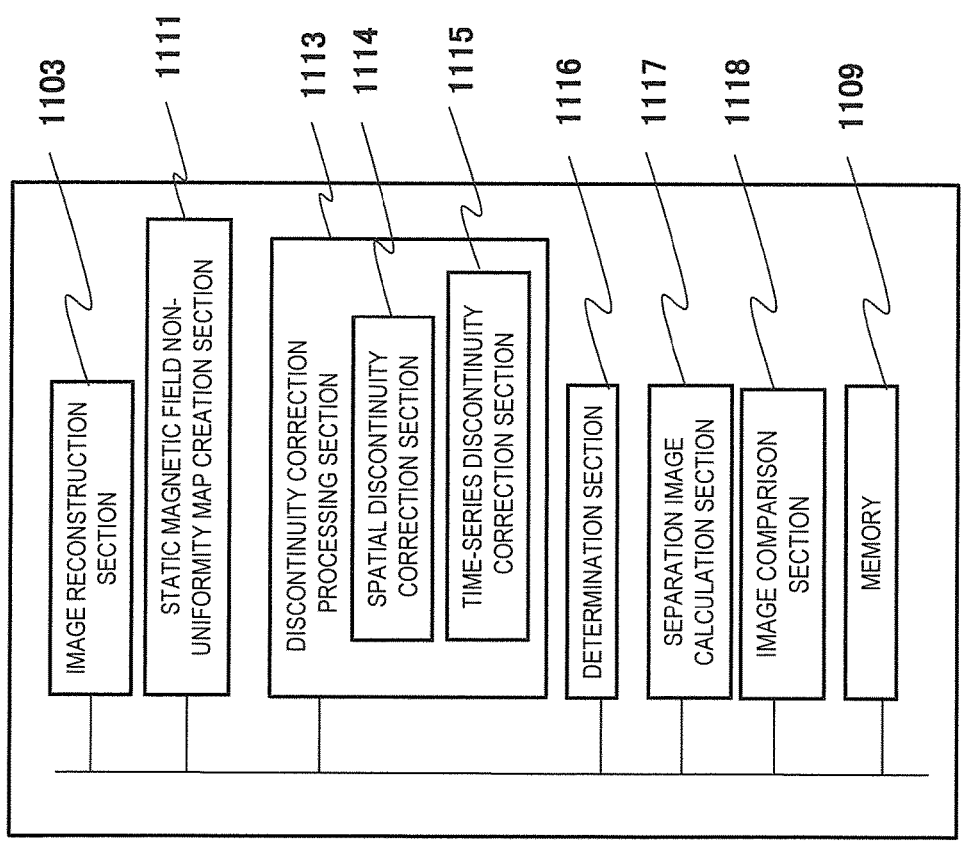
FIG. 3 is a functional block diagram of a main part of the signal processing unit.
Figure 4:
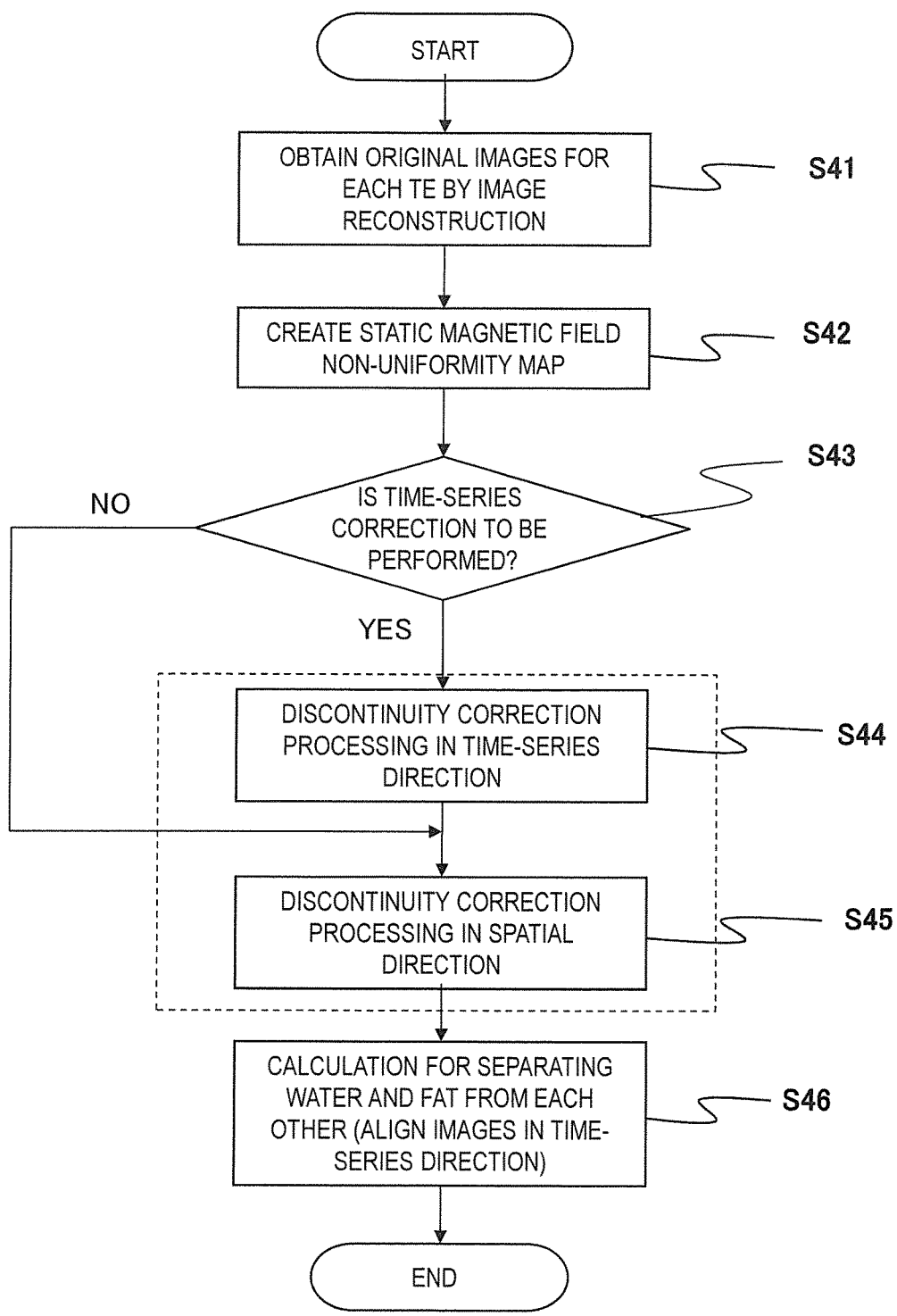
FIG. 4 is a diagram showing the process flow of the signal processing unit in the embodiment.

FIG. 3 is a block diagram of the function related to the operation of image processing and image reconstruction of the signal processing unit 110. As shown in FIG. 3, the signal processing unit 110 includes a static magnetic field non-uniformity map creation section 1111, a discontinuity correction processing section 1113, and a separation image calculation section 1117 as the image processing section 1105 in addition to the image reconstruction section 1103 and a memory 1109. The discontinuity correction processing section 1113 includes a spatial discontinuity correction section 1114 that performs discontinuity correction processing in the spatial direction and a time-series discontinuity correction section 1115 that performs discontinuity correction processing in the time-series direction. The discontinuity correction processing section 1113 may include a determination section 1116 that determines whether or not to perform discontinuity correction processing in the time-series direction and an image comparison section 1118 that determines whether or not to perform image matching in the time-series direction. A plurality of determination sections may be provided according to a determination target, and the function of the determination section 1116 or the image comparison section 1118 may be realized by the operator through the operation unit 113. In this case, the determination section 1116 or the image comparison section 1118 can be omitted. Not only the original image data reconstructed by the image reconstruction section 1103 but also the static magnetic field non-uniformity map created by the static magnetic field non-uniformity map creation section 1111, data under calculation, and the like are stored in the memory 1109.

In addition, each functional section of the signal processing unit 110 shown in FIG. 3 may be constructed on the CPU, for example. Alternatively, some or all functions of the functional sections of the signal processing unit 110 can be realized by hardware other than a CPU 81, for example, an application specific integrated circuit (ASIC) or a field programmable gate array (FPGA).

Next, the operation of the signal processing unit 110 having the above configuration will be described with reference to the operation procedure shown in FIG. 4 and FIGS. 5A to 5D.

Figure 5A:
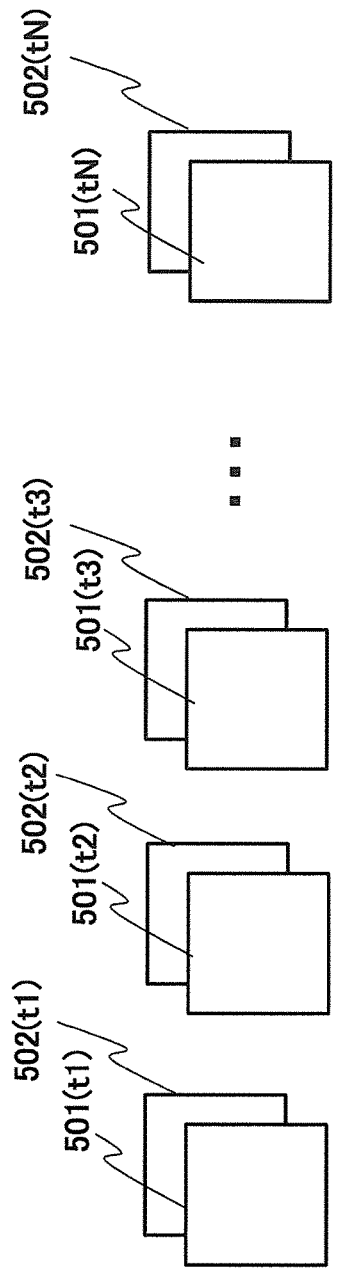
FIGS. 5A to 5D are diagrams showing the concept of discontinuity correction processing in a spatial direction and discontinuity correction processing in a time-series direction, where
Figure 5B:
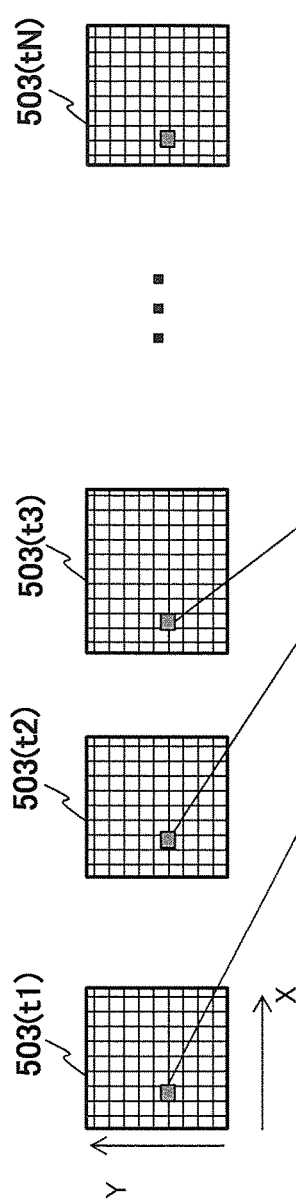

First, the image reconstruction section 1103 reconstructs a plurality of original images from echo signals (echo data) having different echo times that have been acquired by time-series imaging (S41). As an example, FIG. 5A shows two original images 501 and 502 in a 2D pulse sequence. In the diagram, the number in parentheses after each reference numeral indicates the order of imaging. Here, the number in parentheses after each reference numeral indicates that imaging has been performed N times.

Then, the static magnetic field non-uniformity map creation section 1111 creates a static magnetic field non-uniformity map 503 (FIG. 5B) showing phase rotation or frequency shift due to static magnetic field non-uniformity, from the plurality of original images 501 and 502, for each time-series imaging (S42). The specific method of calculating the static magnetic field non-uniformity map 503 will be described in detail in embodiments described below. The static magnetic field non-uniformity map 503 includes pixels corresponding to the respective pixels of the original images, and the value of each pixel is a phase or a frequency.

Then, the discontinuity correction processing section 1113 calculates an offset of the static magnetic field non-uniformity map between time series. Between the time series of small offset, phase wrap or local convergence is eliminated by performing discontinuity correction processing (phase unwrapping processing or region expansion processing) between time series. On the other hand, between the time series of large offset, images between time series are compared, and images that highly match each other are aligned and output.

Specifically, first, for the static magnetic field non-uniformity map obtained for each time-series imaging, the magnitude of the offset of the phase or the frequency in the time-series direction is compared with a predetermined threshold value (S43). When the magnitude of the offset in the time-series direction is within a predetermined threshold value range, discontinuity in the time-series direction is corrected (S44).

Figure 5C:
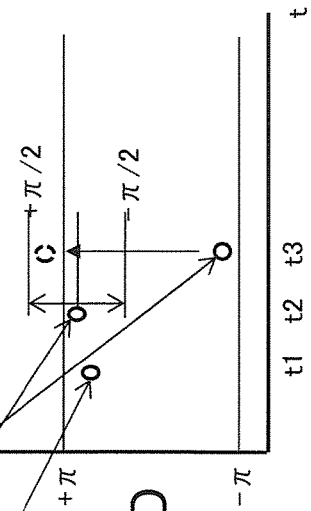
Figure 5D:
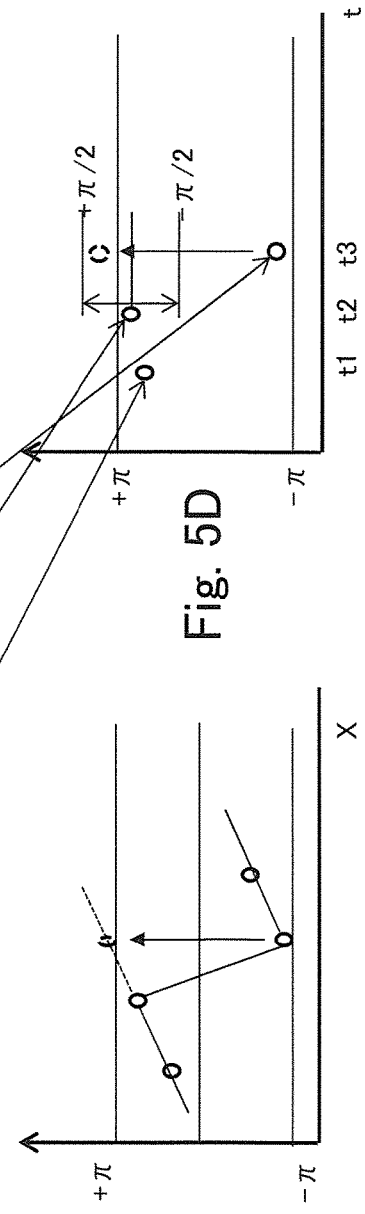

In the discontinuity correction processing in the time-series direction, as shown in FIG. 5D, values of pixels at the same position in static magnetic field non-uniformity maps 503(n) (n is an integer of 1 to N) and 503(n+1) adjacent to each other in the time-series direction are compared. If the difference for eliminating the phase wrap or local convergence is within a predetermined range, the discontinuity correction processing is performed. The discontinuity correction processing in the time-series direction may be performed for all pixels of the static magnetic field non-uniformity map. However, for example, by performing the discontinuity correction processing only for pixels where an object is present in order to eliminate the influence of noise on the pixels, it is possible to obtain more accurate results. When the offset in the time-series direction of the static magnetic field non-uniformity map is out of the predetermined range, there is a high possibility that accurate results will not be obtained even if the discontinuity correction processing is performed. Accordingly, discontinuity correction processing in the time-series direction is not performed.

For pixels after performing the discontinuity correction processing in the time-series direction, or in a case in which no discontinuity correction processing in the time-series direction has been performed, the discontinuity correction processing section 1113 corrects the discontinuity of the phase or frequency in the spatial direction for the static magnetic field non-uniformity map 503 obtained for each time-series imaging (S45). FIG. 5C shows the concept of the discontinuity correction processing in the spatial direction. The discontinuity correction processing in the spatial direction is processing for correcting the phase wrap, for example, in a case in which the static magnetic field non-uniformity map 503 is a phase map. When the phase change between adjacent pixels exceeds $\pi$, processing for adding or subtracting $2\pi$ to or from one side is performed to make the phase change continuous. This processing is advanced by detecting and correcting discontinuity while performing a scan sequentially in vertical and horizontal directions with a predetermined pixel as a reference.

The order in which the discontinuity correction processing (S45) in the spatial direction and the discontinuity correction processing (S44) in the time-series direction are performed is not limited. For example, the discontinuity correction processing in the time-series direction may be performed after performing the discontinuity correction processing in the spatial direction for the static magnetic field non-uniformity map 503 obtained by each imaging. Alternatively, correction processes may be sequentially performed by performing the other processing for pixels having been subjected to one processing, for example, by performing the discontinuity correction processing in the spatial direction for pixels having been subjected to the discontinuity correction processing in the time-series direction. That is, the discontinuity correction processing performed in the present embodiment is four-dimensional discontinuity correction processing in which the time axis is added to the space (three dimensions). Steps S44 to S45 are performed for each pixel.

Finally, the separation image calculation section 1117 creates a plurality of types of tissue contrast images using the corrected static magnetic field non-uniformity maps and the plurality of original images (S46). The calculation performed by the separation image calculation section 1117 is the same as the calculation in the known Dixon method, and will be described in detail in embodiments described below.

In a case in which no discontinuity correction processing in the time-series direction is performed (in a case in which the offset in the time-series direction of the static magnetic field non-uniformity map is out of the predetermined range) from the comparison result in step S43, replacement between a plurality of types of images obtained in step S46 is corrected by comparison between images adjacent to each other in the time-series direction. The replacement between images occurs in the form in which phase wrap or local convergence occurs between two static magnetic field non-uniformity maps and as a result, some of a plurality of types of images created based on these, for example, some of water images and fat images are replaced with each other and a fat image is included in continuous water images. The replacement between images can be detected by evaluating the degree of matching between adjacent images. By replacing the replaced images with each other again, time-series images are obtained in which images of the same type are aligned.

A plurality of types of tissue contrast images that are finally obtained in time series are appropriately displayed on the display unit 111.

As described above, the MRI apparatus of the present embodiment includes an imaging unit that applies a high frequency magnetic field and a gradient magnetic field to the object placed in the static magnetic field and collects a plurality of echo signals by changing echo time in one imaging and a signal processing unit that creates a plurality of images having different echo times using the plurality of echo signals having different echo times. The signal processing unit includes: a static magnetic field non-uniformity map creation section that creates a static magnetic field non-uniformity map showing phase rotation or frequency shift, which occurs in each of the plurality of images due to static magnetic field non-uniformity, using the plurality of images; a spatial direction discontinuity correction section that performs discontinuity correction processing, which is for correcting the discontinuity of the phase or the frequency in the spatial direction, for the static magnetic field non-uniformity map acquired by the one imaging; and a time-series discontinuity correction section that performs discontinuity correction processing, which is for correcting the discontinuity of the phase or the frequency in the time-series direction, for a plurality of static magnetic field non-uniformity maps acquired by time-series imaging. A plurality of types of time-series images having different tissue contrasts are created using a plurality of images having different echo times and the static magnetic field non-uniformity map having been subjected to the discontinuity correction processing in the spatial direction and/or the time-series direction.

The signal processing unit further includes an image comparison section that compares the plurality of types of time-series images between images adjacent to each other in the time-series direction and determines the degree of matching between the images. According to the determination result of the image comparison section, a time-series image is obtained in which images of the same type are aligned.

According to the MRI apparatus of the present embodiment, it is possible to acquire an image (tissue contrast image) showing the state of tissue more accurately in dynamic imaging. In addition, according to the present embodiment, since partial phase wrap (or local convergence) of the static magnetic field non-uniformity map when performing imaging repeatedly in time series is reduced, it is possible to create an accurate static magnetic field non-uniformity map more stably. By creating the accurate static magnetic field non-uniformity map, it is possible to obtain a water image and a fat image in which the replacement between water and fat has been reduced. Even when phase wrap (or local convergence) occurs in a certain entire time-series static magnetic field non-uniformity map, it is possible to reduce the replacement between a water image and a fat image.

Embodiments will be described below by further applying the invention to the two-point Dixon method and the three-point Dixon method based on the configuration of the MRI apparatus of the present embodiment described above. In the following embodiments, a two-point Dixon method with static magnetic field correction based on phase unwrapping processing and a three-point Dixon method with static magnetic field correction using an iterative calculation based on the least squares estimation will mainly be described. However, the invention is not limited thereto, and can also be similarly applied to the three-point Dixon method and the multi-point Dixon method. Also in this case, it is possible to achieve the same effect.

First Embodiment

A first embodiment is an embodiment in which the two-point Dixon method is used. In addition, the configuration of the apparatus of the present embodiment is the same as that of the embodiment described above, and FIGS. 1 to 3 will appropriately be referred to hereinafter.

Figure 6:
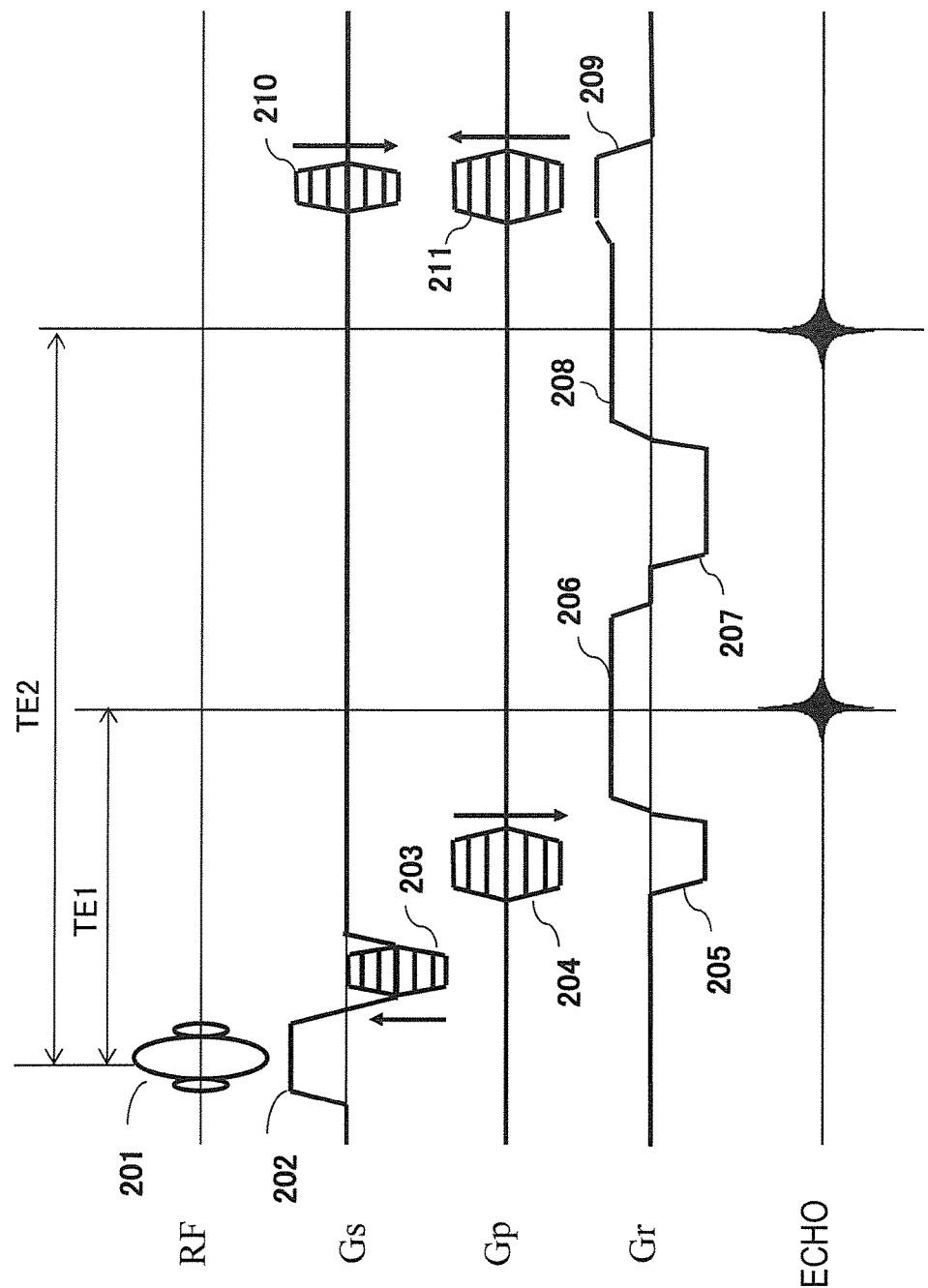
FIG. 6 is a diagram showing an example of the gradient echo sequence in a two-point Dixon method.

First, a pulse sequence used in the two-point Dixon method used in the present embodiment will be described. FIG. 6 shows an example of the pulse sequence. The pulse sequence is a steady-state free precession type three-dimensional gradient echo sequence, and is a sequence for acquiring two types of image data having different TEs. The control unit 112 transmits the pulse sequence through the RF transmission unit 108 by performing the following control. That is, only the tomographic volume of interest is excited by applying a slice encoding gradient magnetic field 202 using the gradient magnetic field coil 103 simultaneously with the emission of an RF pulse 201, and a slice encoding gradient magnetic field 203 for encoding position information in the slice direction is applied.

Then, a phase encoding gradient magnetic field 204 for encoding the position information is applied, and a frequency encoding gradient magnetic field (pre-pulse) 205 in the negative direction is applied. Then, a first echo signal is generated after TE1 has passed from the RF pulse by applying a frequency encoding gradient magnetic field 206 in the positive direction. Then, a second echo signal is generated after TE2 has passed from the RF pulse by applying a frequency encoding gradient magnetic field (rewind pulse) 207 in the negative direction and a frequency encoding gradient magnetic field 208 in the positive direction again. In the case of obtaining an image in which water and fat are separated from each other, for example, TE1 is a time when echo signals obtained from water and fat have opposite phases, and TE2 is a time when the echo signals obtained from water and fat have the same phase.

Then, a frequency encoding gradient magnetic field 209 (spoiler pulse) in the positive direction is applied. At the same time, a slice encoding gradient magnetic field 210 (rewind pulse) and a phase encoding gradient magnetic field 211 (rewind pulse) are applied so as to cancel out the slice encoding gradient magnetic field 203 and the phase encoding gradient magnetic field 204, respectively.

By repeatedly executing such a sequence by the number of times of slice encoding and phase encoding while changing the area of the slice encoding gradient magnetic fields 203 and 210 and the phase encoding gradient magnetic fields 204 and 211, echo signals corresponding to the number of times of slice encoding and phase encoding are collected. The echo signals received by the receiving coil 105 are acquired as k-space data by the signal detection unit 109, and are processed by the signal processing unit 110.

Figure 7:
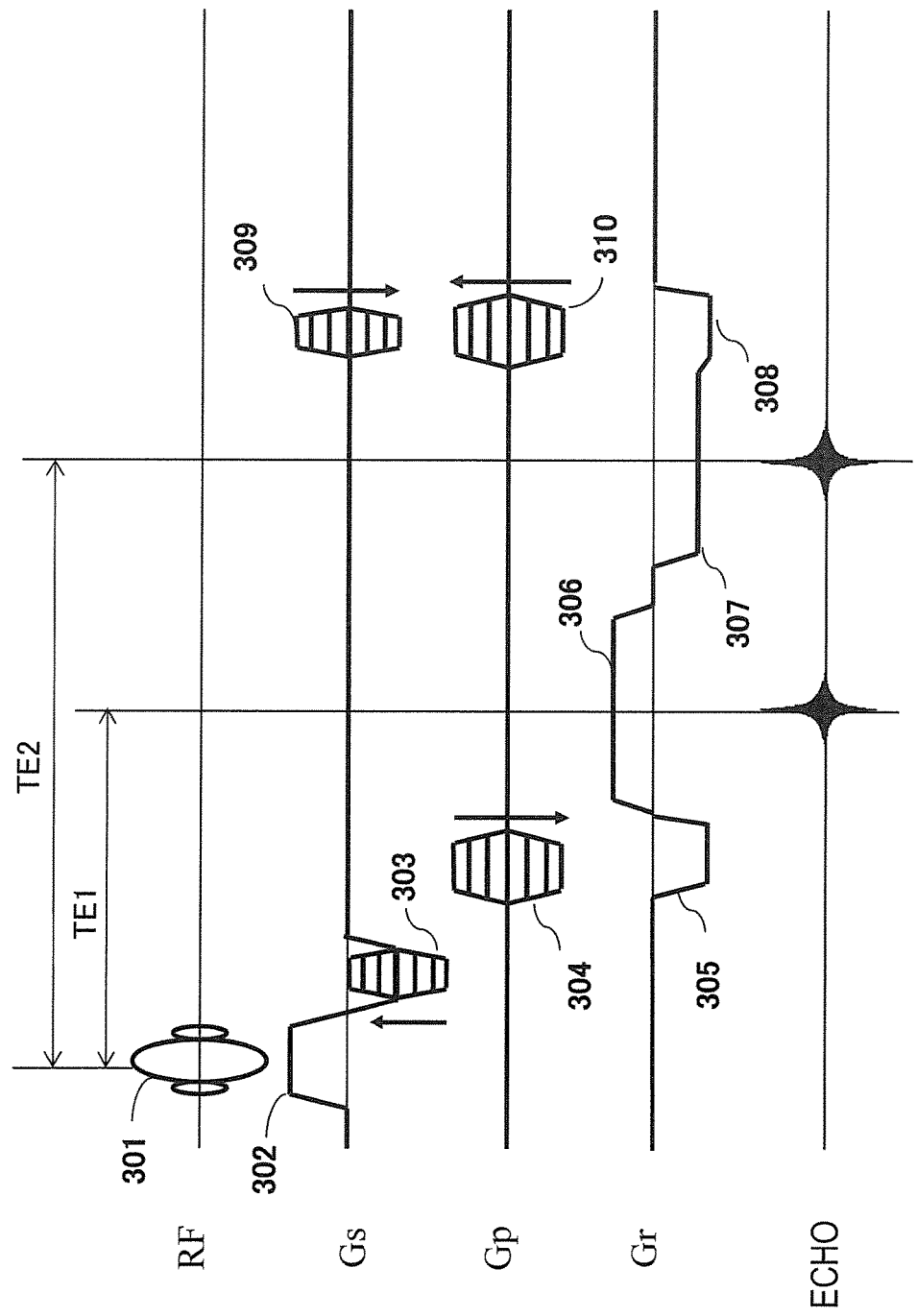
FIG. 7 is a diagram showing another example of the gradient echo sequence in a two-point Dixon method.

The pulse sequence shown in FIG. 6 is an example, and there are various other pulse sequences of gradient echoes used in the two-point Dixon method. FIG. 7 shows another example.

In the pulse sequence shown in FIG. 7, a method of generating the second echo signal in the frequency encoding gradient magnetic field in the negative direction after TE2 has passed is used. This is advantageous in that it is possible to shorten the time between TE1 and TE2 compared with the pulse sequence shown in FIG. 6.

In the pulse sequence, only the tomographic volume of interest is excited by applying a slice encoding gradient magnetic field 302 simultaneously with the emission of an RF pulse 301, and a slice encoding gradient magnetic field 303 for encoding position information in the slice direction is applied. Then, a phase encoding gradient magnetic field 304 for encoding the position information is applied, and a frequency encoding gradient magnetic field (pre-pulse) 305 in the negative direction is applied. Then, a first echo signal is generated after TE1 has passed from the RF pulse by applying a frequency encoding gradient magnetic field 306 in the positive direction. Then, a second echo signal is generated after TE2 has passed from the RF pulse by applying a frequency encoding gradient magnetic field 307 in the negative direction. Then, a frequency encoding gradient magnetic field 308 (spoiler pulse) in the negative direction is applied. At the same time, a slice encoding gradient magnetic field 309 (rewind pulse) and a phase encoding gradient magnetic field 310 (rewind pulse) are applied so as to cancel out the slice encoding gradient magnetic field 303 and the phase encoding gradient magnetic field 304, respectively. Here, the RF pulse 301, the slice encoding gradient magnetic fields 302 and 303, the phase encoding gradient magnetic field 304, the frequency encoding gradient magnetic field 305, the frequency encoding gradient magnetic field 306, the slice encoding gradient magnetic field 309, and the phase encoding gradient magnetic field 310 correspond to the RF pulse 201, the slice encoding gradient magnetic fields 202 and 203, the phase encoding gradient magnetic field 204, the pre-pulse 205, the frequency encoding gradient magnetic field 206, the slice encoding gradient magnetic field 210, and the phase encoding gradient magnetic field 211 shown in FIG. 6, respectively. Their operations and effects are basically the same.

Figure 8:
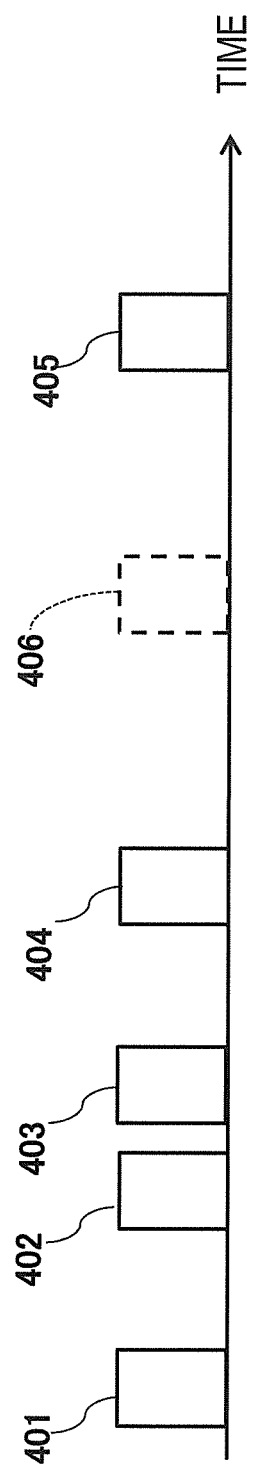
FIG. 8 is a diagram showing the concept of dynamic imaging.

The MRI apparatus (control unit 112) of the present embodiment performs imaging according to the pulse sequence as dynamic imaging. FIG. 8 is a diagram showing the concept of dynamic imaging, and white rectangles indicate imagings 401 to 405 for acquiring image data over the imaging range according to the pulse sequence shown in FIG. 6 or 7. A rectangle shown by a dotted line indicates different imaging from the dynamic imaging, which is performed using a waiting time between imagings having a relatively long interval therebetween (in FIG. 8, between imagings 404 and 405). For example, the rectangle shown by the dotted line indicates imaging 406 of a T2-weighted image, and is added when necessary.

The imaging interval changes with the travel time of the contrast agent used for the dynamic imaging or the imaging part. For example, in the case of dynamic imaging of the liver, first image data is acquired by the first imaging 401 before the administration of a contrast agent. The imaging 401 is performed during a period of about 20 seconds in a state in which breathing is stopped. Then, after the administration of a contrast agent, at a time according to the dyeing condition of the contrast agent in the order of imagings 402, 403, and 404, the same imaging section as in the imaging 401 is imaged during a period of about 20 seconds in a state in which breathing is stopped. Finally, the imaging 405 is performed at a time at which the contrast agent dyes completely.

Figure 9:
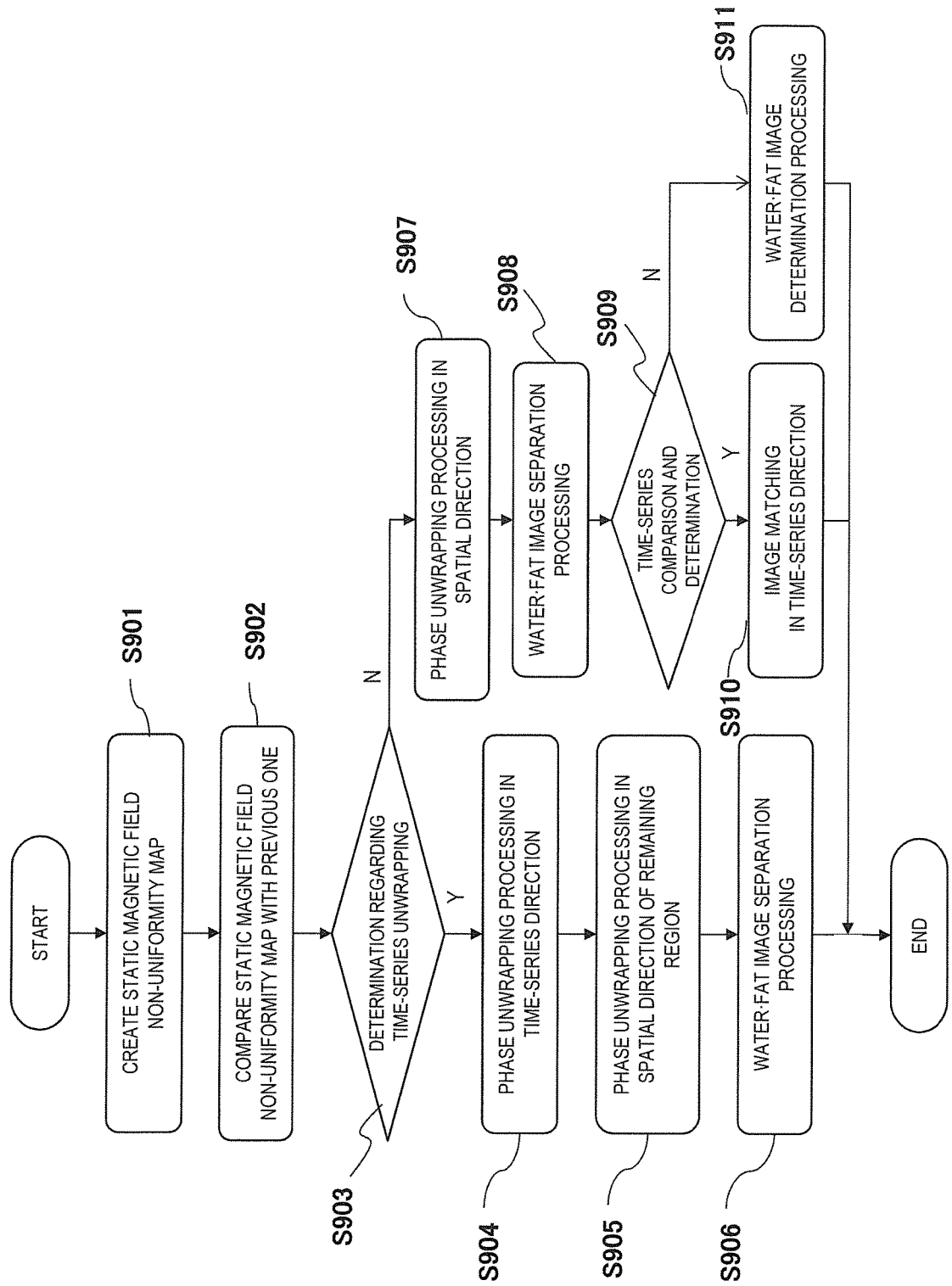
FIG. 9 is a diagram showing the process flow in a first embodiment.

Next, based on the above-described configuration, the operation of the MRI apparatus of the present embodiment, in particular, the processing of the signal processing unit will be described. FIG. 9 is a diagram showing the process flow of the signal processing unit 110. Here, it is assumed that a program for executing the process flow is stored in the image processing section 1105 and the image processing section 1105 executes the processing of each step described with reference to FIG. 9. The process flow shown in FIG. 9 is executed for each imaging number of dynamic imaging. In the following explanation, an image (original image) of complex data obtained by being set in TE for which echo signals obtained from water and fat have opposite phases is assumed to be an image S1 of TE1, and an image (original image) of complex data obtained by being set in TE for which echo signals obtained from water and fat have the same phase is assumed to be an image S2 of TE2.

(Step S901)

The static magnetic field non-uniformity map creation section 1111 calculates a static magnetic field non-uniformity map from the image S1 of TE1 and the image S2 of TE2 stored in the image database 1104. Assuming that the static magnetic field non-uniformity map is P and a phase subtraction image obtained by subtracting the phase of the image S1 of TE1 from the image S2 of TE2 is T, a static magnetic field non-uniformity map P can be calculated by the following Equations (1) and (2).

[No. 1]

$$T(x, y, z, t) = S2(x, y, z, t) \times \frac{S1^*(x, y, z, t)}{|S1(x, y, z, t)|} \quad (1)$$

[No. 2]

$$P(x, y, z, t) = T(x, y, z, t) \times \frac{T(x, y, z, t)}{|T(x, y, z, t)|} \quad (2)$$

In Equation (1), x is the horizontal coordinates of an image, and y is the vertical coordinates of the image. x indicates the slice number of the image, t indicates the imaging number of dynamic imaging, and *indicates a complex conjugate (the same hereinbelow). In Equation (2), the phase of the phase subtraction image T is doubled to calculate the static magnetic field non-uniformity map P of complex data. This is because the phases of water and fat are shifted from each other by 180° and accordingly the phases of water and fat are aligned by doubling the phase of the phase subtraction image T. Although not shown, the static magnetic field non-uniformity map creation section 1111 may reduce the phase wrap of phase unwrapping processing by reducing the influence of noise by performing processing using a low pass filter or smoothing on the static magnetic field non-uniformity map P.

(Step S902)

Between the current imaging and the previous imaging of the imaging number (t−1), a phase offset due to the shift of a resonance frequency or the like is calculated. A phase offset α is calculated by taking the phase difference between the static magnetic field non-uniformity map P and a static magnetic field non-uniformity map based on the previous imaging. However, in the case of the first imaging number, this step is skipped.

[No. 3]

$$\alpha(t) = \arg\{\Sigma_{x,y,z} P(x,y,z,t) \times P^*(x,y,z,t-1)\} \quad (3)$$

arg in Equation (3) indicates that a phase is calculated from complex data.

(Step S903)

The determination section 1116 determines whether or not to perform time-series phase unwrapping processing using the phase offset α calculated in step S902. In a case in which the phase offset α is large, a risk that the phase wrap in the time-series direction cannot be resolved is high even if the time-series phase unwrapping processing is performed. Accordingly, it is preferable that the time-series phase unwrapping processing is not performed. Therefore, for example, if the phase offset α is −π/2 to π/2, it is determined that the time-series phase unwrapping processing is to be performed, and the process proceeds to step S904. In a case in which the phase offset α is less than −π/2 or exceeds π/2, that is, in a case in which the absolute value of α is large, it is determined that the time-series phase unwrapping processing is not to be performed, and the process proceeds to step S907. However, in the case of the first imaging number, the time-series phase unwrapping processing is not performed. Accordingly, the process proceeds to step S907.

(Step S904)

Figure 10:
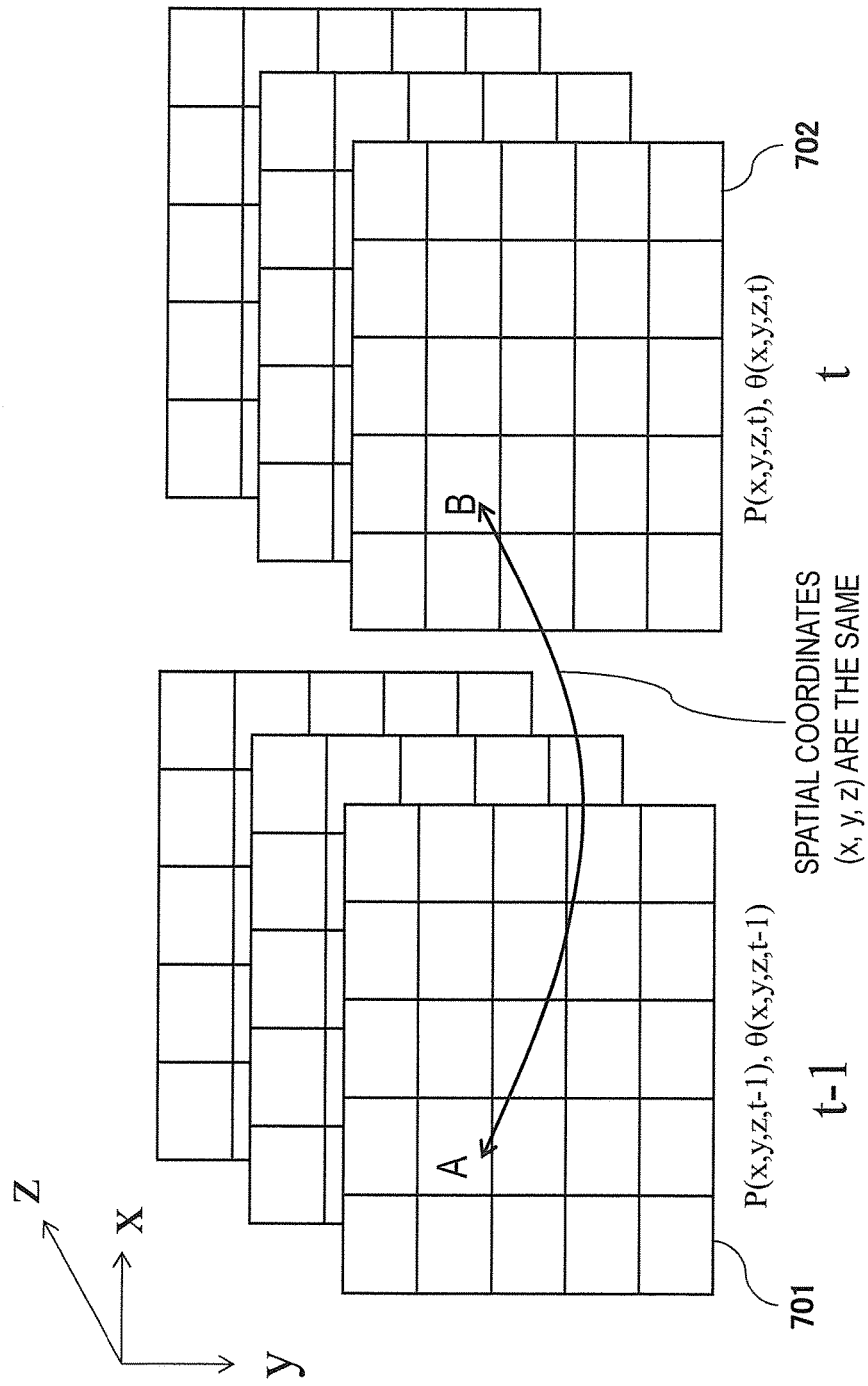
FIG. 10 is a diagram showing the concept of phase unwrapping processing in the time-series direction.

The discontinuity correction processing section 1113 (time-series discontinuity correction section 1115) performs time-series phase unwrapping processing using the static magnetic field non-uniformity map of the previous imaging number. FIG. 10 is a diagram showing the data of static magnetic field non-uniformity maps of dynamic imaging. Here, FIG. 10 shows 3D static magnetic field non-uniformity maps 701 and 702. In FIG. 10, θ is a phase-unwrapped static magnetic field non-uniformity map, and the phase is expressed as the information of an angle. In the phase unwrapping processing in the time-series direction, from a phase-unwrapped pixel (for example, A) at the coordinates (t−1) in the time-series direction, an unprocessed pixel (for example, B) having the same spatial coordinates (xyz) at the coordinates (t) in the time-series direction is phase-unwrapped as an adjacent pixel.

Assuming that the static magnetic field non-uniformity map of the previous imaging number is P(x, y, z, t−1), the phase-unwrapped static magnetic field non-uniformity map is θ(x, y, z, t−1), and the static magnetic field non-uniformity map of the current imaging number is P(x, y, z, t), the static magnetic field non-uniformity map θ(x, y, z, t) after phase unwrapping processing is as follows.

[No. 4]

$$\theta(x,y,z,t) = \theta(x,y,z,t-1) + \arg\{P(x,y,z,t) \times P^*(x,y,z,t-1)\} \quad (4)$$

Although step S904 is performed for each pixel in the static magnetic field non-uniformity map, step S904 does not necessarily need to be performed for all pixels. For example, the influence of noise is eliminated by performing step S904 only for certain pixels of an object, so that phase wrap that remains after phase unwrapping processing can be further reduced.

In addition, by performing the processing of step S904 only when the phase difference between a phase-unwrapped pixel and an unprocessed pixel adjacent to each other is small (for example, in the range of −π/2 to π/2), it is possible to further reduce the phase wrap. When a shift occurs between the breath-hold position in the previous (t−1) imaging and the breath-hold position in the current (t) imaging, a phase change increases or the object position is shifted. Accordingly, adjacent pixels may become noise. Also in this case, it is possible to accurately calculate the phase-unwrapped static magnetic field non-uniformity map θ by determining whether or not to perform phase unwrapping processing based on certain pixels of the object or the phase difference between adjacent pixels.

(Step S905)

After the phase unwrapping processing in the time-series direction, the spatial discontinuity correction section 1114 performs spatial phase unwrapping processing to phase-unwrap remaining unprocessed pixels (pixels that have not been subjected to phase unwrapping processing in the time-series direction). Unprocessed pixels occur when adjacent pixels of the previous imaging number have not been phase-unwrapped or when the phase difference between pixels adjacent to each other in the time-series direction is large (out of range of $-\pi/2$ to $\pi/2$). In a case in which there are unprocessed pixels that are spatially adjacent to phase-unwrapped pixels in the time-series direction, spatial phase unwrapping processing is performed until the unprocessed pixels, for which phase unwrapping processing can be performed, are eliminated by performing the phase unwrapping processing on the unprocessed pixels.

The phase unwrapping processing in the spatial direction is performed in both of the positive and negative directions of each of the coordinate axes of x, y, and z, similar to Equation (4). For example, Equation (5) is used for the phase unwrapping processing from y+1 to y.

[No. 5]

$$\theta(x,y,z,t)=\theta(x,y+1,z,t)+\arg\{P(x,y,z,t)\times P^*(x,y+1,z,t)\} \quad (5)$$

The order of the phase unwrapping processing in the time-series direction shown in step S904 and the phase unwrapping processing in the spatial direction shown in step S905 may be changed for each pixel to be region-expanded. That is, it is possible to perform four-dimensional phase unwrapping processing for the four-dimensional static magnetic field non-uniformity map of x, y, z, and t. Regarding the order of pixels to be subjected to phase unwrapping processing in steps S904 and S905, a method, such as processing unprocessed pixels, which are adjacent (adjacent spatially and in time series) to the phase-unwrapped pixel, in descending order of signal values (absolute value of the static magnetic field non-uniformity map P), can be combined to reduce the phase wrap more than in the known three-dimensional phase unwrapping processing of x, y, and z.

(Step S906)

The separation image calculation section 1117 performs phase correction of the image S2(x, y, z, t) of TE2 first using the phase-unwrapped static magnetic field non-uniformity map θ(x, y, z, t). In this case, since pixels that have not been phase-unwrapped are included in the phase-unwrapped static magnetic field non-uniformity map θ(x, y, z, t), values for the pixels that have not been phase-unwrapped are calculated by extrapolation. The value of the phase is doubled in step S901. Accordingly, in the phase correction of the image S2(x, y, z, t) of TE2, a phase correction image S2'(x, y, z, t) is calculated by subtracting the half of the phase of the static magnetic field non-uniformity map θ(x, y, z, t) from the image S2(x, y, z, t). That is, when the imaginary number is expressed as i and the exponential function is expressed as e, the phase correction image S2'(x, y, z, t) is calculated by the following Equation (6).

[No. 6]

$$S2'(x,y,z,t)=S2(x,y,z,t)\times e^{-i\theta(x,y,z,t)/2}=S2(x,y,z,t)\times\{\cos(\theta(x,y,z,t)/2)-i\sin(\theta(x,y,z,t)/2)\} \quad (6)$$

Then, the separation image calculation section 1117 creates a water image W by performing complex addition between the image S1(x, y, z, t) of TE1 and the phase correction image S2'(x, y, z, t), and creates a fat image F by performing complex subtraction between the image S1(x, y, z, t) of TE1 and the phase correction image S2'(x, y, z, t). That is, the water image W(x, y, z, t) and the fat image F(x, y, z, t) are calculated by the following Equations (7-1) and (7-2), respectively.

[No. 7]

$$W(x,y,z,t)=S1(x,y,z,t)+S2'(x,y,z,t) \quad (7\text{-}1)$$

$$F(x,y,z,t)=S1(x,y,z,t)-S2'(x,y,z,t) \quad (7\text{-}2)$$

Then, the obtained image data is output to the image transmission section 1107.

(Step S907)

When it is determined that time-series phase unwrapping processing is not to be performed, the spatial discontinuity correction section 1114 calculates the phase-unwrapped static magnetic field non-uniformity map θ(x, y, z, t) by performing spatial phase unwrapping processing using the static magnetic field non-uniformity map P(x, y, z, t) of the current imaging number. In this case, in the phase unwrapping processing, a pixel (starting pixel) to start the processing is determined, and pixels adjacent to the starting pixel in any of the x, y, and z directions are phase-unwrapped in order. As the starting pixel, for example, a pixel in which the absolute value of the static magnetic field non-uniformity map P(x, y, z, t) is the greatest is set. As the value of the phase-unwrapped static magnetic field non-uniformity map θ(x, y, z, t) of the starting pixel, the phase of the static magnetic field non-uniformity map P(x, y, z, t) of the same coordinates is set. Regarding the order of pixels to be subjected to phase unwrapping processing, a method, such as processing unprocessed pixels, which are adjacent (spatially adjacent) to the phase-unwrapped pixel, in descending order of signal values (absolute value of the static magnetic field non-uniformity map P), can be combined to reduce the phase wrap. The phase unwrapping method is the same as that in step S905.

(Step S908)

The separation image calculation section 1117 creates a water image W(x, y, z, t) and a fat image F(x, y, z, t) using the phase-unwrapped static magnetic field non-uniformity map θ(x, y, z, t), the image S1(x, y, z, t) of TE1, and the image S2(x, y, z, t) of TE2. Details of the processing are the same as those in step S906.

(Step S909)

The image comparison section 1118 compares the time-series images, and determines whether or not to perform processing for aligning the images between time series. For the first imaging number in the dynamic imaging, it is determined that no processing for aligning images is to be performed, and the process proceeds to step S911. For the other imaging numbers, it is determined that the processing for aligning images is to be performed, and the process proceeds to step S910.

(Step S910)

It is compared whether or not the water image W(x, y, z, t−1) and the fat image F(x, y, z, t−1) in previous imaging match the water image W(x, y, z, t) and the fat image F(x, y, z, t) created in step S908 in the current imaging. In a case in which the comparison result is "match", the water image W(x, y, z, t) and the fat image F(x, y, z, t) are output to the image transmission section 1107 as they are. In a case in which the comparison result is "no match", the water image W(x, y, z, t) and the fat image F(x, y, z, t) are output to the image transmission section 1107 after replacing the pieces of data with each other. In the case of "no match", offset phase wrap occurs in the static magnetic field non-uniformity map θ. Accordingly, for phase unwrapping processing of the next imaging number, the phase wrap is removed by adding or subtracting 2π for all pixels of the static magnetic field non-uniformity map θ.

Several methods are used when the image comparison section 1118 compares two images and determines whether or not the two images match each other. One of these is a method of calculating a correlation between images. For example, a correlation Qwf between the fat image F(x, y, z, t−1) in previous imaging and the water image W(x, y, z, t) in current imaging and a correlation Off between the fat image F(x, y, z, t−1) in previous imaging and the fat image F(x, y, z, t) in current imaging are calculated. These correlations are calculated by the following Equations (8) and (9).

[No. 8]
$$Qwf = \frac{\sum_{x,y,z} |W(x, y, z, t)| \times |F(x, y, z, t-1)|}{\sqrt{\sum_{x,y,z} |W(x, y, x, t)|^2} \times \sqrt{\sum_{x,y,z} |F(x, y, x, t-1)|^2}} \quad (8)$$

[No. 9]
$$Qff = \frac{\sum_{x,y,z} |F(x, y, z, t)| \times |F(x, y, z, t-1)|}{\sqrt{\sum_{x,y,z} |F(x, y, x, t)|^2} \times \sqrt{\sum_{x,y,z} |F(x, y, x, t-1)|^2}} \quad (9)$$

It is assumed that the images match each other when the correlation Qff is larger than the correlation Qwf and do not match each other when the correlation Qwf is larger than the correlation Qff. Any of the water image and the fat image can be used as a reference for comparison. However, since the signal of the water image is changed by the inflow of the contrast agent, it is desirable to set the fat image as a reference for comparison.

As another comparison method, there is a method of calculating the differences Dwf and Dff between the water image W(x, y, z, t−1) and the fat image F(x, y, z, t−1) in previous imaging and the water image W(x, y, z, t) and the fat image F(x, y, z, t) in current imaging. The differences Dwf and Dff are given by the following Equations (10) and (11).

[No. 10]
$$Dwf = \sum_{x,y,z} ||W(x, y, z, t)| - |F(x, y, z, t-1)|| \quad (10)$$

[No. 11]
$$Dff = \sum_{x,y,z} ||F(x, y, z, t)| - |F(x, y, z, t-1)|| \quad (11)$$

It is assumed that the images match each other when the difference Dff is smaller than the difference Dwf and do not match each other when the difference Dwf is smaller than the difference Dff.

In the above-described method of comparing whether or not the time-series images match each other, it is possible to directly compare the images with each other. Therefore, it is possible to reduce the replacement between the imaging numbers of the water image and the fat image by performing the water-fat determination processing described in step S911 for each imaging number.

(Step S911)

In step S909, water-fat determination processing is performed for the image of the first imaging number that has been determined that the processing for aligning images between time series is not to be performed. There are several methods for the water- fat determination processing. For example, there is a method of calculating the signal ratio for each pixel of the image S1 of TE1 and the image S2 of TE2 and determining an image occupying a region with a large signal ratio variation to be a water image. The region of the water image is calculated by performing threshold value processing or the like using the separated water image W and fat image F. As another method, there is a method of creating the histograms of the water image W(x, y, z, t) and the fat image F(x, y, z, t), and performing determination from the tendency (for example, determining an image having a large dispersion of the histogram to be a fat image).

The processing of step S911 may be performed before steps S909 and S910, so that the replacement between images based on the comparison between time-series images and the determination result may be performed for images of the second and subsequent imaging numbers. The images output to the image transmission section 1107 after the processing of steps S906, S910, and S911 are displayed on the display unit 111 as time-series image.

According to the present embodiment, since the influence of the phase offset or partial phase change of the static magnetic field non-uniformity map that occurs in the time-series direction is further reduced, it is possible to display time-series images of more accurate water and fat images. In addition, for the time-series direction, the processing is performed after determining the necessity of the phase unwrapping processing in the time-series direction depending on the magnitude of the phase offset. Therefore, it is possible to reduce the remaining of the phase wrap that is not resolved by the phase unwrapping processing in the time-series direction.

Up to now, the processing of images obtained by dynamic imaging using the two-point Dixon method has been described. However, also in the case of using the three-point Dixon method, the method for the phase unwrapping of the static magnetic field non-uniformity map is the same. Therefore, it is possible to apply the present embodiment.

Second Embodiment

A second embodiment is an embodiment in which the three-point Dixon method is used. In the first embodiment, the phase unwrapping processing of the static magnetic field non-uniformity map of the amount of phase rotation has been performed as the discontinuity correction processing. However, in the second embodiment, processing for correcting the discontinuity of the static magnetic field non-uniformity map of the frequency using an iterative calculation based on the least squares estimation is performed as the discontinuity correction processing. Hereinafter, the present embodiment will be described focusing on the differences from the first embodiment. In addition, the configuration of the apparatus of the present embodiment is the same as that of the embodiment described above, and FIGS. 1 to 3 will appropriately be referred to hereinafter.

Figure 11:
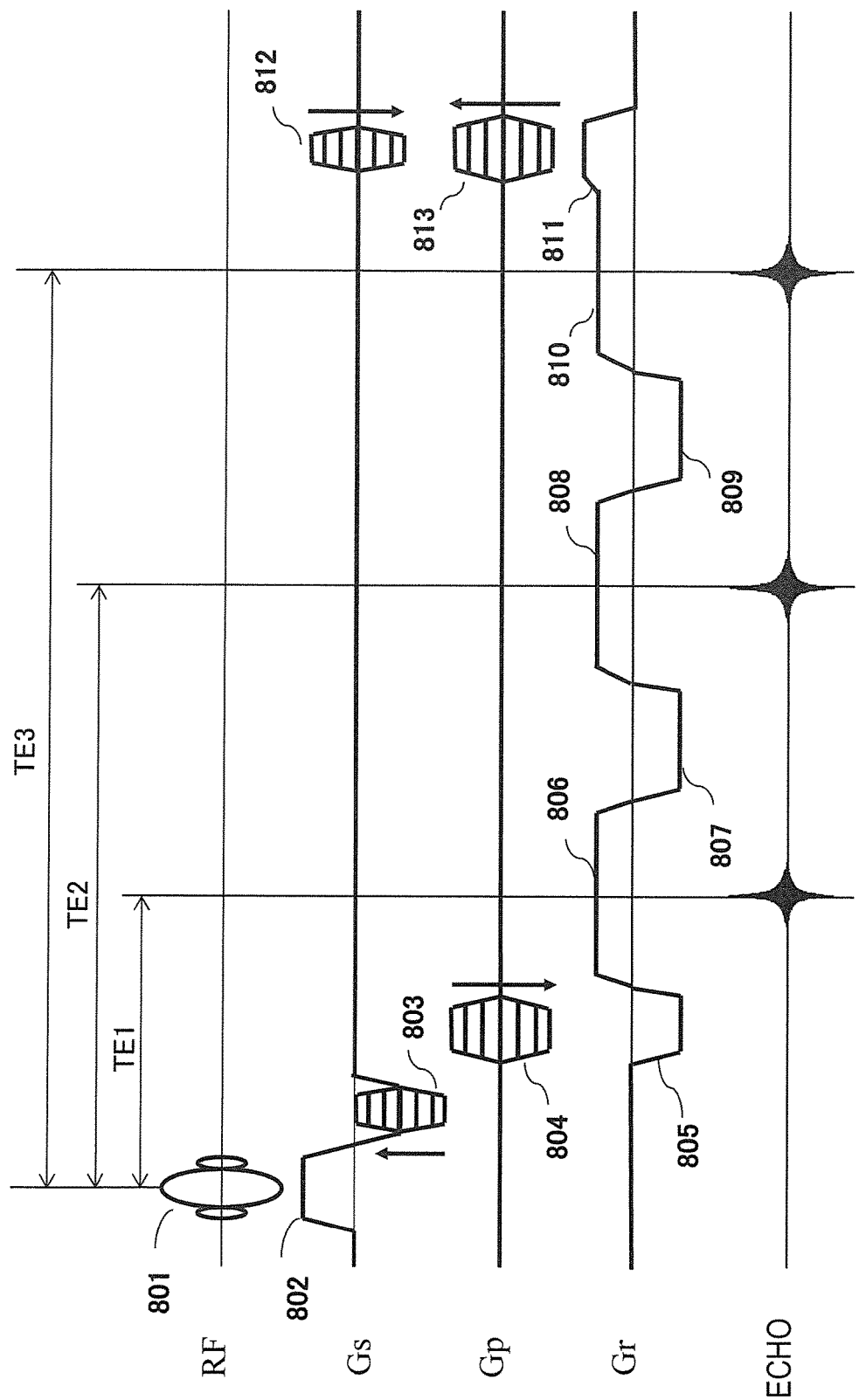
FIG. 11 is an explanatory diagram showing an example of the gradient echo sequence in a three-point Dixon method.

First, a pulse sequence used in the three-point Dixon method used in the present embodiment will be described. FIG. 11 shows an example of the pulse sequence used in the three-point Dixon method. The pulse sequence is a steady-state free precession type three-dimensional gradient echo sequence, and is a sequence for acquiring three types of image data having different TEs.

The control unit 112 transmits the pulse sequence through the RF transmission unit 108 by performing the following control. That is, only the tomographic volume of interest is excited by applying a slice encoding gradient magnetic field 802 simultaneously with the emission of an RF pulse 801, and a slice encoding gradient magnetic field 803 for encoding position information in the slice direction is applied.

Then, a phase encoding gradient magnetic field 804 for encoding the position information is applied, and a frequency encoding gradient magnetic field (pre-pulse) 805 in the negative direction is applied. Then, a first echo signal is generated after TE1 has passed from the RF pulse by applying a frequency encoding gradient magnetic field 806 in the positive direction. Then, a second echo signal is generated after TE2 has passed from the RF pulse by applying a frequency encoding gradient magnetic field (rewind pulse) 807 in the negative direction and a frequency encoding gradient magnetic field 808 in the positive direction again. Then, a third echo signal is generated after TE3 has passed from the RF pulse by applying a frequency encoding gradient magnetic field (rewind pulse) 809 in the negative direction and a frequency encoding gradient magnetic field 810 in the positive direction again. In the case of obtaining an accurate image in which water and fat are separated from each other, for example, TE1 is a time when each echo signal obtained from water and fat has a phase of $-\pi/6$, TE2 is a time when each echo signal obtained from water and fat has a phase of $\pi/2$, and TE3 is a time when each echo signal obtained from water and fat has a phase of $7\pi/6$.

Finally, a frequency encoding gradient magnetic field 811 (spoiler pulse) in the positive direction is applied. At the same time, a slice encoding gradient magnetic field 812 (rewind pulse) and a phase encoding gradient magnetic field 813 (rewind pulse) are applied so as to cancel out the slice encoding gradient magnetic field 803 and the phase encoding gradient magnetic field 804, respectively.

By repeatedly executing such a sequence by the number of times of slice encoding and phase encoding while changing the area of the slice encoding gradient magnetic fields 803 and 812 and the phase encoding gradient magnetic fields 804 and 813, echo signals corresponding to the number of times of slice encoding and phase encoding are collected through the receiving coil 105 by the signal detection unit 109. The collected echo data is stored in the k-space database 1102, and is processed by the signal processing unit 110. The signal processing unit 110 (image reconstruction section 1103) obtains three types of image data having different TEs by performing a three-dimensional Fourier transform of the k-space data. The image data is stored in the image database 1104. Also in the three-point Dixon method using an iterative calculation based on the least squares estimation, TE can be set to any value at which the phase difference between water and fat is different.

Also in the present embodiment, imaging based on the pulse sequence is performed as dynamic imaging, and the procedure is the same as the procedure in the first embodiment described with reference to FIG. 8. By performing such imaging, a plurality of images having different echo times are obtained as time-series original images.

Figure 12:
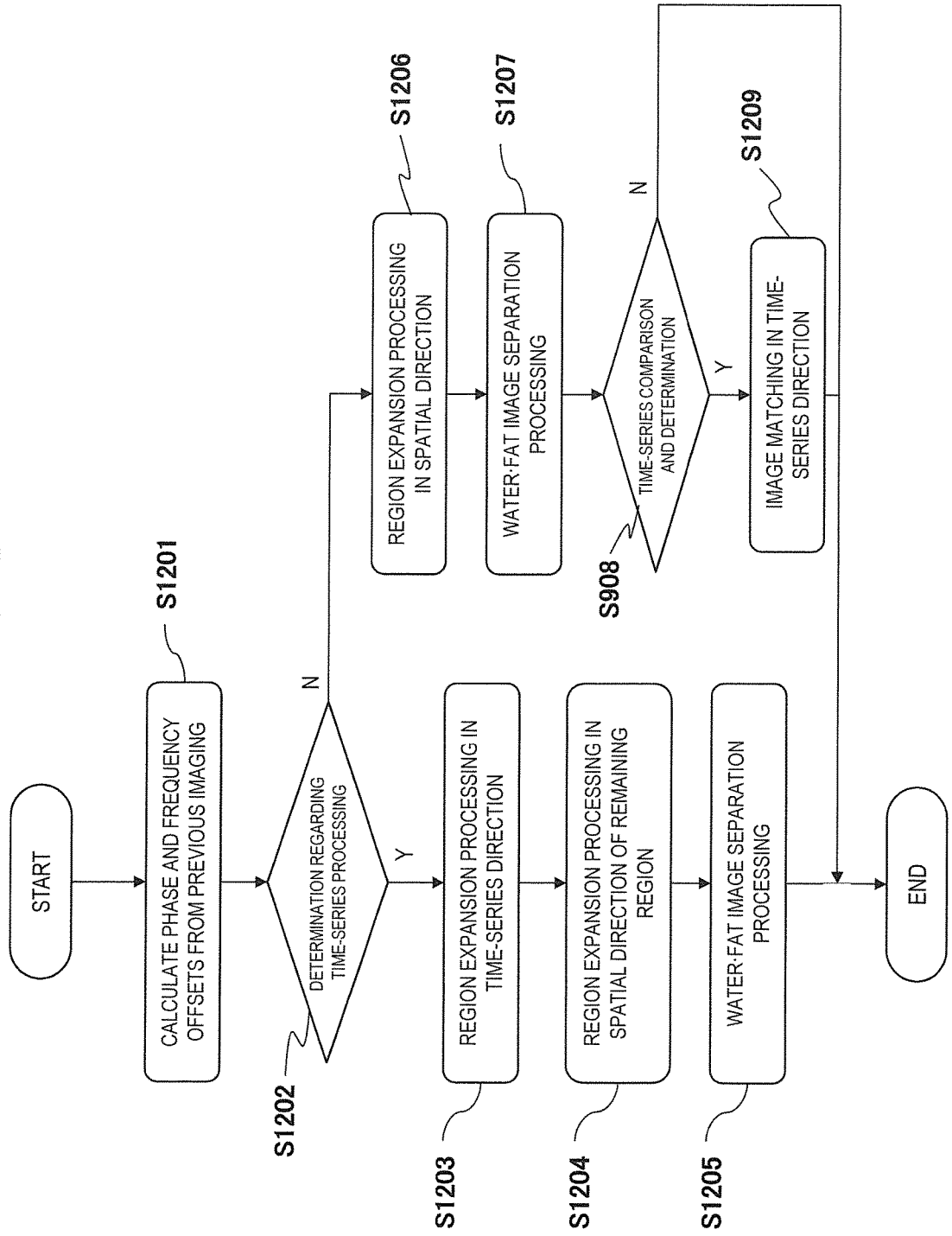
FIG. 12 is a diagram showing the process flow in a second embodiment.

Next, the procedure of water and fat separation processing using a plurality of time-series original images acquired by the above dynamic imaging will be described with reference to FIG. 12. FIG. 12 is a flowchart mainly showing the process of the signal processing unit 110 (image processing section 1105). A program for executing the process flow is stored in the image processing section 1105, and the image processing section 1105 executes the processing of each step described with reference to FIG. 12. The process flow shown in FIG. 12 is executed for each imaging number of dynamic imaging. Here, three images having different TEs will be described on the assumption that the image of TE1 is s1, the image of TE2 is s2, and the image of TE3 is s3.

(Step S1201)

The static magnetic field non-uniformity map creation section 1111 calculates a phase or frequency offset $\Psi_{offset}$ due to the shift of the resonance frequency or the like between the imaging of the image s1(x, y, z, t) of TE1 and the image s2(x, y, z, t) of TE2 and the imaging of the image s1(x, y, z, t-1) of TE1 and the image s2(x, y, z, t-1) of TE2 of the previous imaging number (t-1), which are stored in the image database 1104, using Equation (12). Since the phase and the frequency are physical quantities relevant to each other (phase=2π×frequency×time), any of the phase and the frequency may be used. The present embodiment will be described using the frequency.

[No. 12]

$$\psi_{offset} = \frac{\arg\left\{\sum_{x,y,z} s2(x, y, z, t)s1^*(x, y, z, t) \atop s2^*(x, y, z, t-1)s1(x, y, z, t-1)\right\}}{2 \times \pi \times (TE2 - TE1)} \quad (12)$$

(Step S1202)

The determination section 1116 determines whether or not to perform time-series processing according to the value of the frequency offset. In a case in which the frequency offset $\Psi_{offset}$ is small, it is determined that the time-series processing is to be performed, and the process proceeds to step S1203. In a case in which the frequency offset $\Psi_{offset}$ is large, it is determined that the time-series processing is not to be performed, and the process proceeds to step S1206. The magnitude determination is performed based on the frequency (223 Hz at the time of 1.5 T) due to the chemical shift of fat. For example, it is assumed that the frequency offset $\Psi_{offset}$ is small when the frequency offset $\Psi_{offset}$ is −223/4 to 223/4. This determination is performed in order to avoid the discontinuity correction processing being inaccurate due to the time-series processing, as in step S903 in the first embodiment.

(Step S1203)

Figure 13:
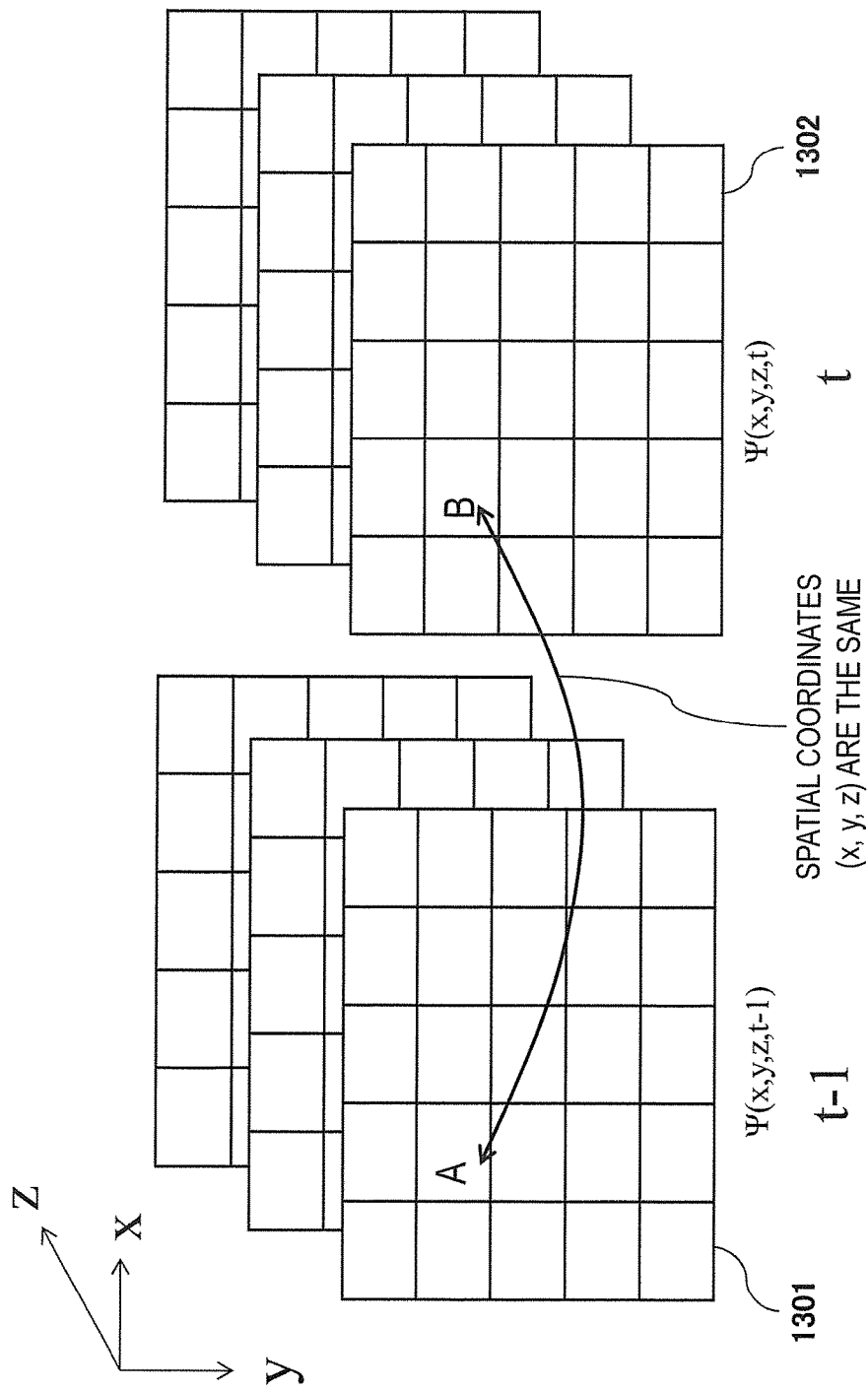
FIG. 13 is a diagram showing the concept of region expansion processing in the time-series direction.

The discontinuity correction processing section 1113 (time-series discontinuity correction section 1115) performs time-series processing using a static magnetic field non-uniformity map Ψ of the previous imaging number. This processing is a process of calculating a static magnetic field non-uniformity map by an iterative calculation based on the least squares estimation, and is referred to as region expansion processing herein. FIG. 13 is a diagram showing the data of static magnetic field non-uniformity maps 1301 and 1302 of dynamic imaging. The static magnetic field non-uniformity map shown in FIG. 13 is expressed as the information of the frequency Ψ. In the region expansion processing in the time-series direction, from a region-expanded pixel (for example, A of 1301) at the coordinates (t-1) in the time-series direction, an unprocessed pixel (for example, B of 1302) having the same spatial coordinates at the coordinates (t) in the time-series direction is region-expanded as an adjacent pixel.

When calculating a static magnetic field non-uniformity map Ψ (x, y, z, t) of the current imaging number, a region-expanded static magnetic field non-uniformity map Ψ(x, y, z, t−1) of the previous imaging number is used as the initial value of the iterative calculation at the time of nonlinear least squares estimation of the nonlinear equations shown in the following Equation (13).

[No. 13]

$$s1(x,y,z,t)=\{W(x,y,z,t)+F(x,y,z,t)\exp(i2\pi f_F \cdot TE1)\}\exp\{i2\pi\psi(x,y,z,t)\cdot TE1\}$$

$$s2(x,y,z,t)=\{W(x,y,z,t)+F(x,y,z,t)\exp(i2\pi f_F \cdot TE2)\}\exp\{i2\pi\psi(x,y,z,t)\cdot TE2\}$$

$$s3(x,y,z,t)=\{W(x,y,z,t)+F(x,y,z,t)\exp(i2\pi f_F \cdot TE3)\}\exp\{i2\pi\psi(x,y,z,t)\cdot TE3\} \quad (13)$$

In Equation (13), $f_F$ is a frequency of the chemical shift of fat. In the case of a 1.5 T apparatus, $f_F$ is 223 Hz. The value of the static magnetic field non-uniformity map Ψ of the corresponding pixel is calculated by iterative calculation of the nonlinear least squares estimation. By performing this region expansion only for certain pixels of the object, it is possible to reduce local convergence.

(Step S1204)

After the region expansion processing in the time-series direction, the discontinuity correction processing section 1113 (spatial discontinuity correction section 1114) performs region expansion processing of an unprocessed pixel that has not been processed in the time-series direction. An unprocessed pixel occurs in a case in which an adjacent pixel of the previous imaging number has not been region-expanded. In a case in which there is an unprocessed pixel spatially adjacent to the region-expanded pixel, the unprocessed pixel is subjected to region expansion processing. The region expansion processing is performed until there is no unprocessed pixel that can be region-expanded.

The region expansion processing is performed in both of the positive and negative directions of each of the coordinate axes of x, y, and z, similar to the region expansion processing between time series. For example, in the case of region expansion from Ψ(x−1, y, z, t) to Ψ(x, y, z, t), Ψ(x−1, y, z, t) is used as the initial value of an iterative calculation based on the nonlinear least squares estimation when calculating Ψ(x, y, z, t).

The order of the region expansion processing in the time-series direction shown in step S1203 and the region expansion processing in the spatial direction shown in step S1204 may be changed for each pixel to be region-expanded. That is, for example, region expansion processing in the time direction is performed between the pixel (x) of imaging (t−1) and the corresponding pixel (x) of imaging (t), and then region expansion processing in the spatial direction is performed between the pixel (x) of imaging (t−1) and the pixel (x+1) of imaging (t). Then, region expansion processing in the time direction is performed between the pixel (x+2) of imaging (t−1) and the corresponding pixel (x+2) of imaging (t), and then region expansion processing in the spatial direction is performed between the pixel (x+2) of imaging (t−1) and the pixel (x+3) of imaging (t). Thus, the region expansion processing of the present embodiment is four-dimensional region expansion processing performed for the four-dimensional static magnetic field non-uniformity map of x, y, z, and t. Regarding the order of pixels to be subjected to region expansion processing, a method, such as processing unprocessed pixels, which are adjacent (adjacent spatially and in time series) to the region-expanded pixel, in descending order of signal values (absolute value of s1×s2×s3), can be combined to reduce local convergence more than in the known three-dimensional region expansion processing of x, y, and z.

(Step S1205)

The separation image calculation section 1117 creates a water image W(x, y, z, t) and a fat image F(x, y, z, t) using the region-expanded static magnetic field non-uniformity map Ψ (x, y, z, t), the image s1(x, y, z, t) of TE1, the image s2 (x, y, z, t) of TE2, and the image s3 (x, y, z, t) of TE3, and outputs the water image W(x, y, z, t) and the fat image F(x, y, z, t) to the image transmission section 1107. In this case, since pixels that have not been region-expanded are included in the region-expanded static magnetic field non-uniformity map Ψ(x, y, z, t), values for the pixels that have not been region-expanded are calculated by extrapolation. The water image W(x, y, z, t) and the fat image F (x, y, z, t) can be calculated by substituting the static magnetic field non-uniformity map Ψ(x, y, z, t) calculated in step S1204 into Equation (13) and performing least squares estimation of the linear equations of the unknowns W(x, y, z, t) and F(x, y, z, t).

(Step S1206)

In the determination step S1202 of the determination section 1116, when it is determined that the time-series region expansion processing is not to be performed, the region-expanded static magnetic field non-uniformity map φ(x, y, z, t) is calculated by performing spatial region expansion processing. In this case, in the region expansion processing, a starting pixel is determined, and pixels adjacent to the starting pixel in any of the x, y, and z directions are region-expanded in order. There is a method of setting, for example, a pixel where signal changes in the image s1 of TE1, the image s2 of TE2, and the image s3 of TE3 are large as the starting pixel. The reason why such a method is used is that the signal change is large in a pixel where water and fat are mixed and that local convergence is difficult to occur in the pixel where water and fat are mixed. Regarding the order of pixels to be subjected to region expansion processing, a method, such as processing unprocessed pixels, which are adjacent (adjacent spatially) to the region-expanded pixel, in descending order of signal values (absolute value of s1×s2×s3), can be combined to reduce local convergence.

(Step S1207)

The separation image calculation section 1117 creates a water image W(x, y, z, t) and a fat image F(x, y, z, t) using the region-expanded static magnetic field non-uniformity map Ψ(x, y, z, t), the image s1(x, y, z, t) of TE1, the image s2(x, y, z, t) of TE2, and the image s3(x, y, z, t) of TE3. Details of the processing are the same as those in step S1205.

(Step S1208)

This processing is the same as step S909 in the first embodiment, and the image comparison section 1118 compares time-series images, and determines whether or not to perform processing for aligning the images between time series. For the first imaging number in the dynamic imaging, it is determined that no processing for aligning images is to be performed, and the process is ended. For the other imaging numbers, it is determined that the processing for aligning images is to be performed, and the process proceeds to step S1209.

(Step S1209)

It is compared whether or not the water image W(x, y, z, t−1) and the fat image F(x, y, z, t−1) in previous imaging match the water image W(x, y, z, t) and the fat image F(x, y, z, t) created in step S1207 in the current imaging. In a case in which the comparison result is "match", the water image W(x, y, z, t) and the fat image F(x, y, z, t) are output to the image transmission section 1107 as they are. In a case in which the comparison result is "no match", the water image W(x, y, z, t) and the fat image F(x, y, z, t) are output to the image transmission section 1107 after replacing the pieces of data with each other. In addition, in the case of "no match", local convergence of the static magnetic field non-uniformity map Ψ occurs. Accordingly, for the region expansion processing of the next imaging number, the frequency of the chemical shift of fat is added or subtracted for all pixels of the static magnetic field non-uniformity map Ψ. The comparison method is the same as the method of step S910 shown in the first embodiment.

Also in the present embodiment, similar to the first embodiment, since the influence of the frequency offset or a partial change in the frequency of the static magnetic field non-uniformity map that occurs in the time-series direction is reduced, it is possible to display time-series images of more accurate water and fat images. In addition, for the time-series direction, the processing is performed after determining the necessity of the region expansion processing in the time-series direction depending on the magnitude of the frequency offset. Therefore, it is possible to reduce the local convergence in the iterative calculation.

Up to now, the processing of images obtained by dynamic imaging using the three-point Dixon method has been described. However, also in the case of using the two-point Dixon method or the multi-point Dixon method, the processing of the present embodiment can be applied.

Third Embodiment

In the MRI apparatuses of the first and second embodiments, the determination section 1116 automatically determines whether or not to perform the time-series phase unwrapping processing or the time-series region expansion processing using the value of the phase offset or the frequency offset of the static magnetic field non-uniformity map. However, an MRI apparatus of the present embodiment includes means allowing the operator to perform such determination. Although image comparison is automatically performed by the image comparison section 1118 in the first and second embodiments, the MRI apparatus of the present embodiment includes means allowing the operator to perform such comparison. Specifically, the determination result or the selection of the operator is received through the operation unit of the MRI apparatus.

The number of items selected by the operator is two of time-series image comparison and four-dimensional phase unwrapping processing or four-dimensional region expansion processing in the time series direction and the spatial direction, and one of these is alternatively selected for each time series.

Also in the present embodiment, the configuration of the apparatus is the same as that in the embodiments described above. Therefore, the present embodiment will be described focusing on the differences. In the following explanation, the diagrams used in the embodiments described above will appropriately be referred to.

FIG. 14 shows a user interface (UI) for selecting four-dimensional phase unwrapping processing and the comparison of time-series images. The "4D Unwrapping" parameter shown in FIG. 14 is a parameter for selecting the execution of four-dimensional phase unwrapping processing or four-dimensional region expansion processing, and OFF and ON can be selected.

When ON is selected in "4D Unwrapping", parameters of "Start number" and "End number" can be input. The parameters of "Start number" and "End number" indicate the range of the imaging number for which four-dimensional phase unwrapping processing or four-dimensional region expansion processing is to be performed.

In a case in which "4D Unwrapping" is OFF (in a case in which ON is not selected) or in a case in which "4D Unwrapping" is ON and there is an imaging number that does not correspond to the range of the imaging number indicated by parameters of "Start number" and "End number", OFF and ON can be selected for the parameter of "Series matching" indicating the execution of comparison between time-series images. When ON is selected, "Standard number" and "Matching number" can be input. "Standard number" is an imaging number that becomes a basis for comparison between time-series images, and "Matching number" is an imaging number for which time-series images are to be compared with each other. As "Matching number", it is possible to input an imaging number that does not correspond to the range of "Start number" to "End number". In addition, in a case in which "Standard number" is not in the range of "Start number" to "End number", "End number" can be input as "Matching number".

Figure 15:
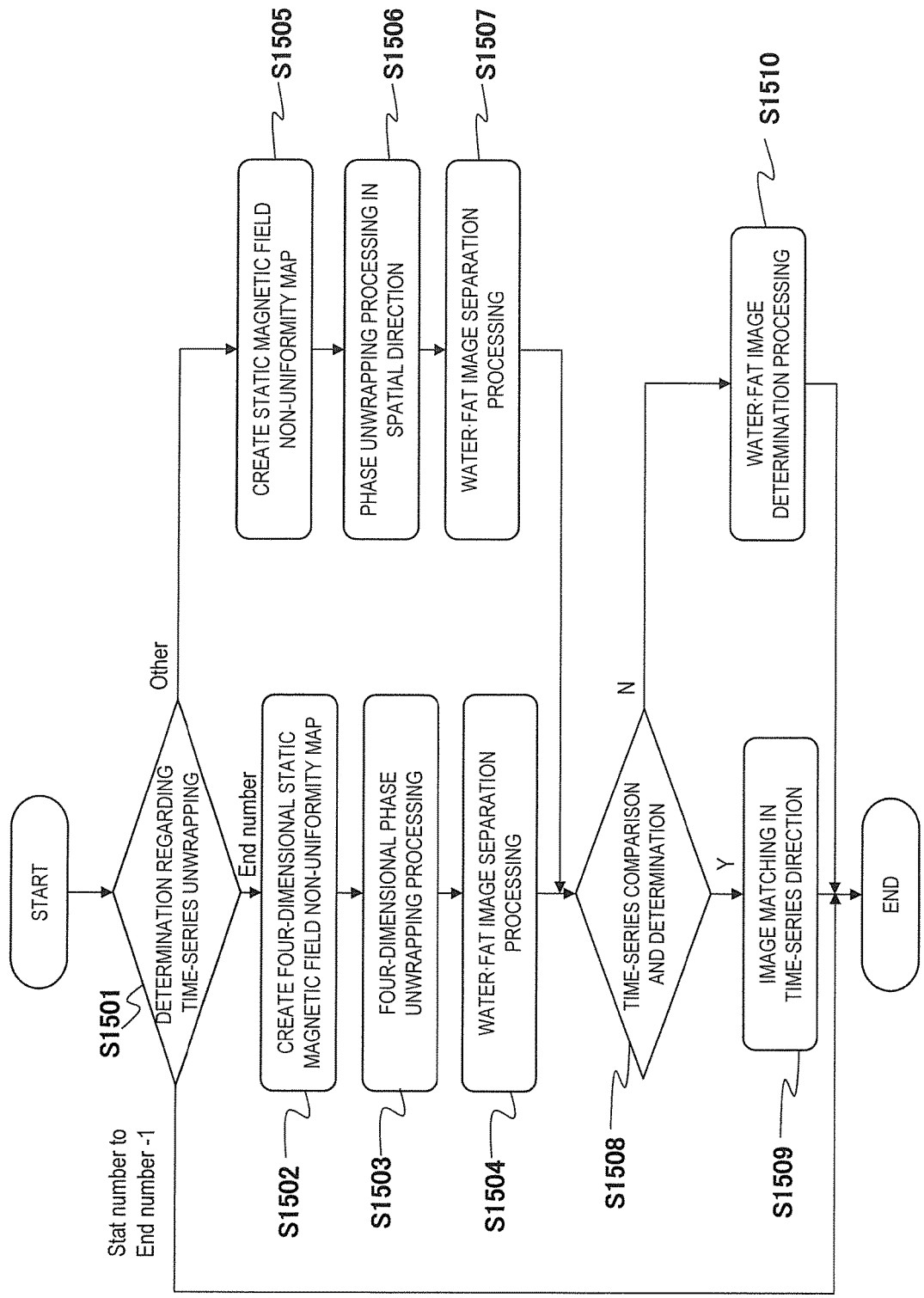
FIG. 15 is a diagram showing the process flow in the third embodiment.

Next, a procedure in the case of applying the present embodiment to the creation of time-series water-fat separation images using the two-point Dixon method will be described with reference to FIG. 15. FIG. 15 is a process flow illustrating the present embodiment. A program for executing the process flow is stored in the image processing section 1105, and the image processing section 1105 executes the processing of each step described with reference to FIG. 15. The process flow shown in FIG. 15 is executed for each imaging number of dynamic imaging.

(Step S1501)

Time-series phase unwrapping is determined using the parameters of "4D Unwrapping", "Start number", and "End number" shown in FIG. 14. When "4D Unwrapping" is ON and the imaging number is equal to or greater than "Start number" and less than "End number", the processing of the current imaging number is ended. When "4D Unwrapping" is ON and the imaging number is "End number", the process proceeds to step S1502. Otherwise, the process proceeds to step S1505.

(Step S1502)

The static magnetic field non-uniformity map P(x, y, z, t) is calculated from the image S1(x, y, z, t) of TE1 and the image S2(x, y, z, t) of TE2 in the range of "Start number" to "End number". The calculation equation is the same as Equations (1) and (2).

(Step S1503)

Using the static magnetic field non-uniformity map P(x, y, z, t) from "Start number" to "End number", four-dimensional phase unwrapping processing in which time series and space are combined is performed. A starting pixel is determined first, and pixels adjacent to the starting pixel in any of the x, y, z, and t directions are phase-unwrapped in order, thereby creating a phase-unwrapped static magnetic field non-uniformity map θ(x, y, z, t).

As the starting pixel, for example, a pixel in which the absolute value of the static magnetic field non-uniformity map P(x, y, z, t) is the greatest in the range of "Start number" to "End number" is set. As the value of the phase-unwrapped static magnetic field non-uniformity map θ(x, y, z, t) of the starting pixel, the phase of the static magnetic field non-uniformity map P(x, y, z, t) of the same coordinates is set. Regarding the order of pixels to be subjected to phase unwrapping processing, it is possible to combine a method, such as processing unprocessed pixels, which are adjacent (adjacent spatially and in time series) to the phase-unwrapped pixel, in descending order of the absolute value of the static magnetic field non-uniformity map P. For example, in the image S1 in which water and fat have opposite phases due to the inflow of the contrast agent, a signal reduction may occur over the wide range. However, by performing the processing in descending order of the absolute value as described above, it is possible to reduce the phase wrap even in a region where it is difficult to remove the phase wrap by three-dimensional phase unwrapping processing considering only the space. The phase unwrapping processing is the same as in the first embodiment, and is performed in both of the positive and negative directions of each of the coordinate axes of x, y, z, and t using Equation (5).

(Step S1504)

Using the four-dimensional phase-unwrapped static magnetic field non-uniformity map θ(x, y, z, t), the image S1(x, y, z, t) of TE1, and the image S2(x, y, z, t) of TE2 in the range of "Start number" to "End number", a water image W(x, y, z, t) and a fat image F(x, y, z, t) from "Start number" to "End number" are created. Details of the processing are the same as those in step S906 in the first embodiment, and the water image W(x, y, z, t) and the fat image F(x, y, z, t) are calculated using Equations (6), (7-1), and (7-2).

(Steps S1505 to S1507)

Steps S1505 to S1507 correspond to a case in which four-dimensional phase unwrapping processing or four-dimensional region expansion processing is not performed, and are the same as steps S901, S907, and S908 in the flowchart (FIG. 9) of the first embodiment. That is, in step S1505, the static magnetic field non-uniformity map P(x, y, z, t) is created using the image S1(x, y, z, t) of TE1 and the image S2(x, y, z, t) of TE2 of the current imaging number. In step S1506, the phase-unwrapped static magnetic field non-uniformity map θ(x, y, z, t) is calculated by performing spatial phase unwrapping processing of the static magnetic field non-uniformity map P(x, y, z, t). Then, in step S1507, the water image W(x, y, z, t) and the fat image F(x, y, z, t) are created using the phase-unwrapped static magnetic field non-uniformity map θ(x, y, z, t), the image S1(x, y, z, t) of TE1, and the image S2(x, y, z, t) of TE2.

(Step S1508)

On the other hand, when "Series matching" is ON and the current imaging number is present in "Matching number" in the UI shown in FIG. 14, the process proceeds to step S1509. Otherwise, the process proceeds to step S1510.

(Step S1509)

Using the water image W(x, y, z, 1) and the fat image F(x, y, z, 1) of the imaging number (in the shown example, t=1) input to the "Standard number" in the UI shown in 14 and the water image W(x, y, z, t) and the fat image F(x, y, z, t) created in step S1207 in the current imaging, image comparison and image matching in the time-series direction are performed. This processing is the same as step S910 in the first embodiment. The necessity of the replacement between images is determined from the degree of matching between the images, and the replacement is performed or not performed according to the determination result. Regarding the replacement between images, in a case in which the current imaging number is "End number", all images from "Start number" to "End number" are replaced with each other.

(Step S1510)

In a case in which "Series matching" in the UI shown in FIG. 14 is OFF (or in a case in which ON is not selected), water-fat determination processing is performed without time-series image comparison. This processing is the same as step S911 in the first embodiment.

In the present embodiment, an example is described in which the user interface and the four-dimensional phase unwrapping processing are applied based on the first embodiment (combination of the two-point Dixon method and the four-dimensional phase unwrapping processing). However, the same can also, be applied to the processing of the second embodiment (combination of the three-point Dixon method and the four-dimensional region expansion processing) by using the same user interface. Before the UI screen shown in FIG. 14, a screen for selecting one of the four-dimensional phase unwrapping processing and the four-dimensional region expansion processing may be displayed such that the operator can select one of the four-dimensional phase unwrapping processing and the four-dimensional region expansion processing.

As described above, the MRI apparatus of the present embodiment includes the operation unit for receiving a selection of discontinuity correction processing in the time-series direction by the operator, and the signal processing unit causes the time-series direction discontinuity correction section to perform discontinuity correction processing when the operation unit receives the selection of discontinuity correction processing in the time-series direction. In addition, the MRI apparatus of the present embodiment includes the operation unit for receiving the designation of the range of discontinuity correction processing in the time-series direction by the operator, and the signal processing unit causes the time-series direction discontinuity correction section to perform discontinuity correction processing in the range of the discontinuity correction processing in the time-series direction received through the operation unit. In addition, the MRI apparatus of the present embodiment includes the image comparison section that compares the plurality of types of time-series images between images adjacent to each other in the time-series direction and determines the degree of matching between images, and includes the operation unit for receiving an instruction of comparison between images in the time-series direction by the operator.

According to the MRI apparatus of the present embodiment, since the means for causing the operator to determine or select whether or not to perform time-series direction discontinuity correction processing is provided, it is possible to further improve the convenience and the accuracy of an image as will be described below.

For example, in the four-dimensional phase unwrapping processing or the four-dimensional region expansion processing, it is possible to reduce the phase wrap or local convergence most by determining one starting pixel and processing the four-dimensional data. However, since it is not possible to create an image for each imaging number, it is not possible to use the four-dimensional phase unwrapping processing or the four-dimensional region expansion processing when it is necessary to check the image in real time. In the present embodiment, since the operator selects an image in a case in which it is not necessary to check the image in real time, it is possible to obtain the most accurate image.

In the first and second embodiments, when the phase offset α or the frequency offset of the static magnetic field non-uniformity map in the time-series direction is equal to or greater than a predetermined value, time-series images are compared with each other (steps S903 and S1202). However, in the case of automatic determination, determination in these steps may be incorrect. In a case in which it is known that the time interval of imaging is empty, it is possible to reduce the phase wrap or local convergence more reliably by allowing the operator to select comparing time-series images with each other without performing the phase unwrapping processing in the time-series direction according to the present embodiment.

Fourth Embodiment

Also in the present embodiment, similar to the third embodiment, means for allowing the operator to select four-dimensional phase unwrapping processing or four-dimensional region expansion processing or time-series image comparison is provided. In the present embodiment, in order to make the selection of the operator more convenient, means for providing information that is a basis of determination of the operator is provided. As such information, for example, there is a time-series change in the resonance frequency.

Hereinafter, the operation of the present embodiment will be described by way of an example in a case in which information to be provided is a time-series resonance frequency. In addition, the apparatus configuration is the same as that in the embodiment described above. In the MRI apparatus of the present embodiment, however, the control unit 112 performs control to measure the resonance frequency for each imaging separately from the pulse sequence of the typical two-point Dixon method or three-point Dixon method.

Figure 16:
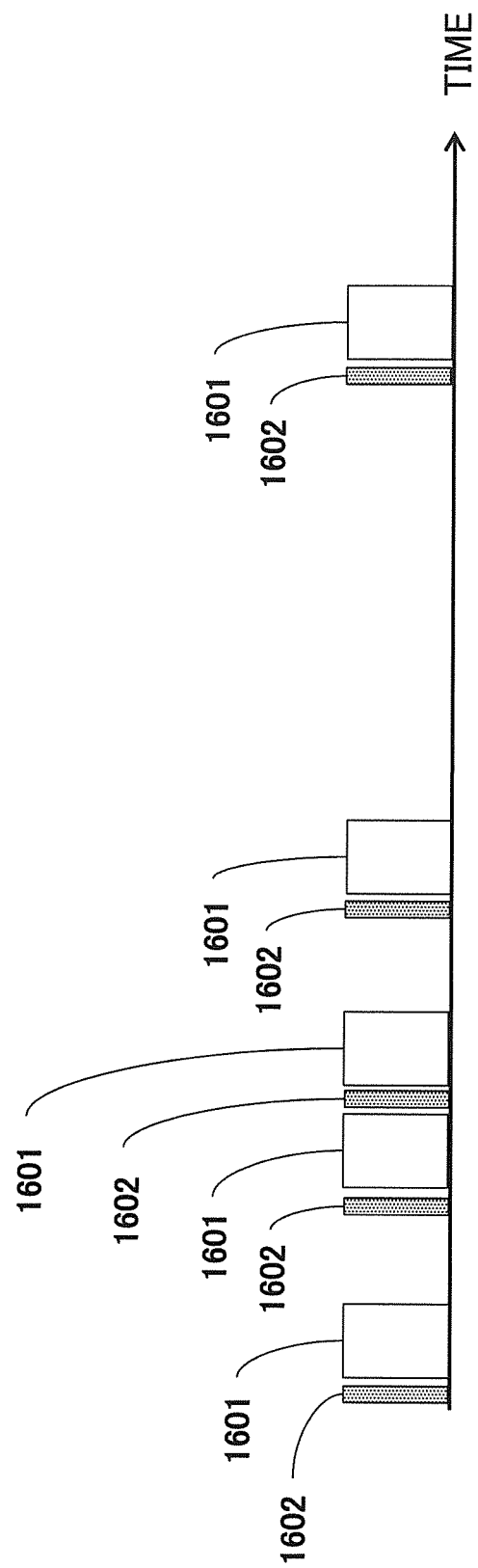
FIG. 16 is a sequence diagram of dynamic imaging in a fourth embodiment.

FIG. 16 shows a sequence diagram of dynamic imaging with resonance frequency measurement. As shown in FIG. 16, in this sequence, measurement 1602 of a resonance frequency is added to measurement 1601 of image data of dynamic imaging. The measurement 1601 is, for example, a repetition of the pulse sequence shown in FIG. 5 or 6. In the measurement 1602 of a resonance frequency, for example, an RF pulse is applied without using a frequency encoding gradient magnetic field or a phase encoding gradient magnetic field, an RF pulse for restoring the spin state is applied, and then an echo signal is measured. A peak frequency in the frequency distribution of the echo signal is a resonance frequency. Such measurement 1602 of the resonance frequency can be performed in an extremely short time.

Figure 17:
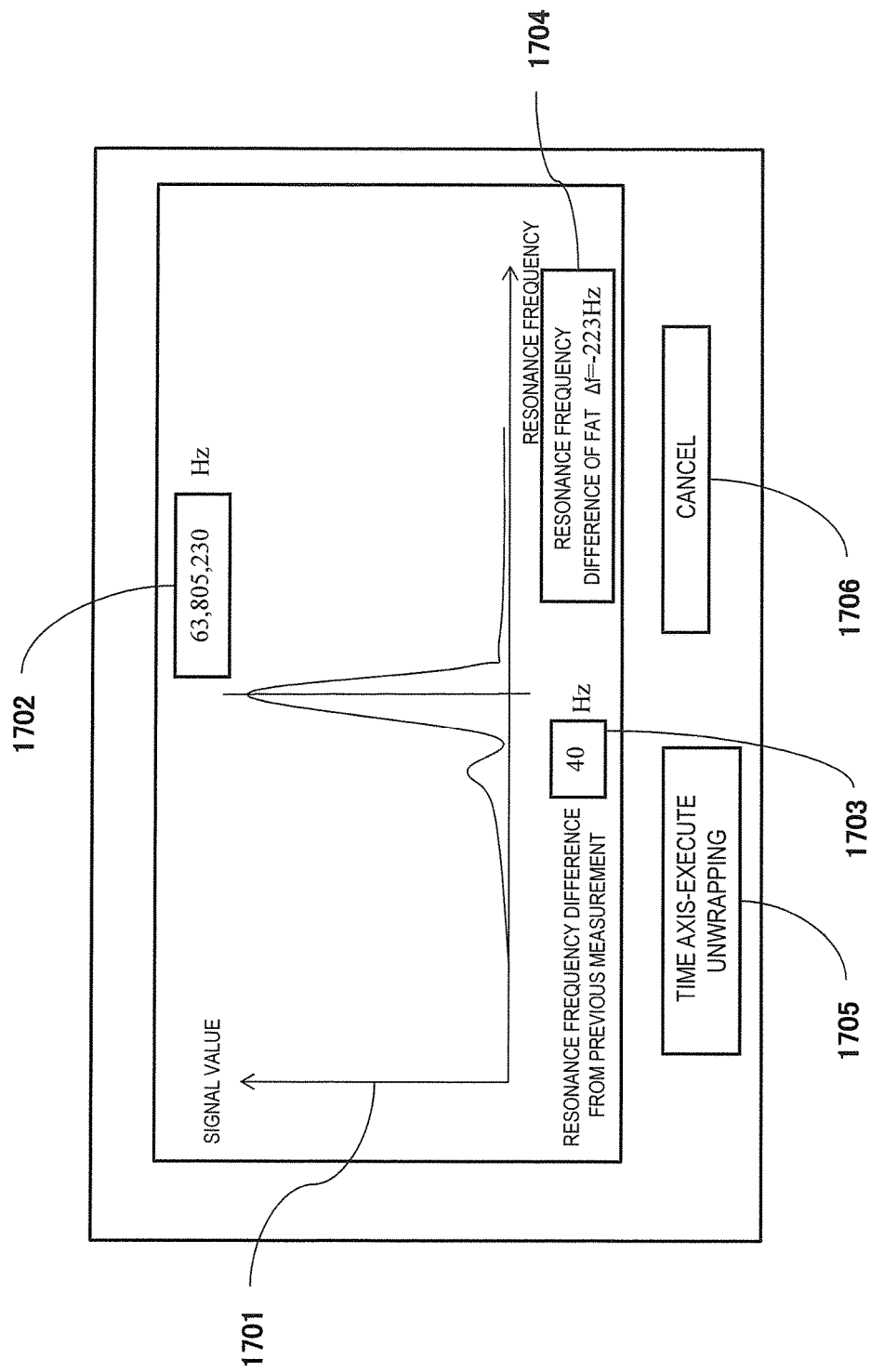
FIG. 17 is a drawing showing an example of user interface in the fourth embodiment.

The resonance frequency measured in this manner is displayed on the display unit 111 for each imaging, for example, as shown in FIG. 17. In the example shown in FIG. 17, a waveform 1701 of the resonance frequency and a value 1702 of the peak frequency are displayed, and UIs 1705 and 1706 for selecting the phase unwrap in the time-series direction are displayed. In addition, a difference 1703 from a resonance frequency measured at the time of previous imaging or a resonance frequency difference 1704 of fat are displayed. The resonance frequency difference 1704 of fat is a fixed value depending on the magnetic field strength, and is −223 Hz in a case in which the magnetic field strength is 1.5 T.

The operator can select either a button 1705 to select the phase unwrap in the time-series direction or a button 1706 not to select the phase unwrap in the time-series direction by checking the value 1702 of the resonance frequency or the difference 1703 from the previous resonance frequency and checking the resonance frequency difference 1704 of fat.

The process flow of the signal processing unit in the present embodiment is the same as that of the flow shown in FIG. 9 or 12. In a case in which the operator presses the button 1705 to select the phase unwrap in the time-series direction, for example, in the flow shown in FIG. 9, Y is selected in the time-series unwrap determination step S903, and the process proceeds to S904. In a case in which the button 1706 not to select the phase unwrap in the time-series direction is pressed, N is selected in the time-series unwrap determination step S903, and the process proceeds to S907. This is the same for the flow shown in FIG. 12 in which region expansion processing in the time-series direction is performed. In the present embodiment, however, since the selection of the phase unwrap in the time-series direction is determined by checking the displayed resonance frequency, step S902 in FIG. 9 or step S1201 in FIG. 12 can be omitted.

Thus, according to the present embodiment, for each measurement 1601 of image data, the operator can check the frequency offset and select phase unwrapping processing or region expansion processing in the time-series direction.

In the above explanation, only the UI for the selection of the phase unwrapping processing or the region expansion processing in the time-series direction has been described. However, in a case in which no processing in the time-series direction is selected, it is needless to say that the operator can also select a time-series image comparison using the UI shown in FIG. 14 as in the third embodiment.

As described above, the MRI apparatus of the present embodiment includes the operation unit for receiving the selection of discontinuity correction processing in the time-series direction by the operator or an instruction of comparison between images in the time-series direction by the operator. In addition, the imaging unit performs resonance frequency measurement for each imaging, and the operation unit includes a display unit that displays a resonance frequency for each imaging measured by the imaging unit. Therefore, as in the third embodiment, it is possible to improve the accuracy of an image and the convenience of the operator.

While the embodiments of the MRI apparatus and the method of the invention have been described above, the invention is not limited to the embodiments, and changes, such as deleting some components or adding another component, can be appropriately made. In addition, the processing or the method used in each embodiment can be appropriately combined with the processing or the method used in the other embodiments.

In the above embodiments, the signal processing unit has been described as a part of components of the MRI apparatus. However, the function (calculation function shown in FIGS. 2 and 3) of the signal processing unit may be a modality (image processing apparatus) different from the MRI apparatus. In this case, it is possible to perform the operation in each of the above-described embodiments independently of the imaging of the MRI apparatus.

REFERENCE SIGNS LIST

1: MRI apparatus
101: object
102: static magnetic field generation magnet
103: gradient magnetic field coil
104: irradiation coil
105: receiving coil
106: bed
107: gradient magnetic field power source
108: RF transmission unit 109: signal detection unit
110: signal processing unit
111: display unit
112: control unit
1101: signal receiving section
1102: k-space database
1103: image reconstruction section
1104: image database
1105: image processing section
1107: image transmission section
1106: parameter storage section
1109: memory
1111: static magnetic field non-uniformity map creation section
1113: discontinuity correction processing section
1114: spatial discontinuity correction section
1115: time-series discontinuity correction section
1116: determination section
1117: separation image calculation section
1118: image comparison section

What is claimed is:

1. A magnetic resonance imaging apparatus, comprising:
an imaging unit that applies a high frequency magnetic field and a gradient magnetic field to an object placed in a static magnetic field and collects a plurality of echo signals by changing an echo time in one imaging; and
a signal processing unit that creates a plurality of images having different echo times using a plurality of echo signals having different echo times,
wherein the signal processing unit includes:
a static magnetic field non-uniformity map creation section that creates a static magnetic field non-uniformity map, which shows phase rotation or frequency shift occurring in the plurality of images due to static magnetic field non-uniformity, using the plurality of images;
a spatial direction discontinuity correction section that performs discontinuity correction processing, which is for correcting discontinuity of a phase or a frequency in a spatial direction, for a static magnetic field non-uniformity map acquired by the one imaging; and
a time-series direction discontinuity correction section that performs discontinuity correction processing, which is for correcting discontinuity of a phase or a frequency in a time-series direction, for a plurality of static magnetic field non-uniformity maps acquired by time-series imaging, and
a plurality of types of time-series images having different tissue contrasts are created using the plurality of images having different echo times and the static magnetic field non-uniformity map obtained by performing the discontinuity correction processing in the spatial direction and/or the time-series direction.

2. The magnetic resonance imaging apparatus according to claim 1,
wherein the signal processing unit determines whether or not an offset of the phase or the frequency of the static magnetic field non-uniformity map in the time-series direction is within a range of a predetermined threshold value, and performs discontinuity correction processing in the time-series direction using the time-series direction discontinuity correction section and discontinuity correction processing in the spatial direction using the spatial direction discontinuity correction section when it is determined that the offset is within the range of the predetermined threshold value.

3. The magnetic resonance imaging apparatus according to claim 2,
wherein the signal processing unit determines whether or not the offset of the phase or the frequency of the static magnetic field non-uniformity map in the time-series direction is within the range of the predetermined threshold value, and performs discontinuity correction processing in the spatial direction using the spatial direction discontinuity correction section without performing discontinuity correction processing in the time-series direction when it is determined that the offset is out of the range of the predetermined threshold value.

4. The magnetic resonance imaging apparatus according to claim 1,
wherein the signal processing unit further includes an image comparison section that compares the plurality of types of time-series images between images adjacent to each other in the time-series direction and determines a degree of matching between the images, and
a time-series image in which images of the same type are aligned is created according to a determination result of the image comparison section.

5. The magnetic resonance imaging apparatus according to claim 1,
wherein the discontinuity correction processing performed by the time-series direction discontinuity correction section is phase unwrapping processing in the time-series direction.

6. The magnetic resonance imaging apparatus according to claim 1,
wherein the discontinuity correction processing performed by the time-series direction discontinuity correction section is processing for correcting discontinuity of the frequency using an initial value of an iterative calculation based on least squares estimation.

7. The magnetic resonance imaging apparatus according to claim 5,
wherein the time-series direction discontinuity correction section performs discontinuity correction processing by performing region expansion processing with a reference pixel as a starting point.

8. The magnetic resonance imaging apparatus according to claim 1,
wherein the imaging performed by the imaging unit is imaging based on a two-point Dixon method for acquiring an echo signal at each of first and second echo times,
the first echo time is a time at which a phase of a water proton and a phase of a fat proton, which are changed after application of a high frequency magnetic field, are aligned, and
the second echo time is a time at which the phase of the water proton and the phase of the fat proton after application of a high frequency magnetic field are shifted from each other by 180°.

9. The magnetic resonance imaging apparatus according to claim 1,
wherein the imaging performed by the imaging unit is imaging based on a three-point Dixon method for acquiring an echo signal at each of first, second, and third echo times, and
the respective echo times are set to times at which phase differences between a phase of a water proton and a phase of a fat proton, which are changed after application of a high frequency magnetic field, are different.

10. The magnetic resonance imaging apparatus according to claim 1, further comprising:
an operation unit that receives a selection of discontinuity correction processing in the time-series direction from an operator,
wherein the signal processing unit performs discontinuity correction processing using the time-series direction discontinuity correction section when the operation unit receives a selection of discontinuity correction processing in the time-series direction.

11. The magnetic resonance imaging apparatus according to claim 10, further comprising:
an operation unit that receives a designation of a range of discontinuity correction processing in the time-series direction from the operator,
wherein the signal processing unit performs discontinuity correction processing using the time-series direction discontinuity correction section in the range of discontinuity correction processing in the time-series direction received through the operation unit.

12. The magnetic resonance imaging apparatus according to claim 10, further comprising:
an image comparison section that compares the plurality of types of time-series images between images adjacent to each other in the time-series direction and determines a degree of matching between the images, and
an operation unit that receives an instruction of comparison between images in the time-series direction from the operator.

13. The magnetic resonance imaging apparatus according to claim 10,
wherein the imaging unit performs resonance frequency measurement for each imaging, and
the operation unit includes a display unit that displays a resonance frequency for each imaging measured by the imaging unit.

14. A time-series image creation method of forming a plurality of types of tissue contrast images as time-series images in a magnetic resonance imaging apparatus by calculation between original images using a plurality of original images reconstructed from echo signals having different echo times that are acquired in respective time-series imagings by the magnetic resonance imaging apparatus, the method comprising:
creating a static magnetic field non-uniformity map showing phase rotation or frequency shift due to static magnetic field non-uniformity, from the plurality of original images, for each of the time-series imagings;
correcting discontinuity of a phase or a frequency in a spatial direction for the static magnetic field non-uniformity map obtained for each of the time-series imagings;
comparing an offset of a phase or a frequency in a time-series direction with a predetermined threshold value for the static magnetic field non-uniformity map obtained for each of the time-series imagings;
correcting discontinuity in the time-series direction when the discontinuity in the time-series direction is within a predetermined threshold value range; and
creating a plurality of types of tissue contrast images using the corrected static magnetic field non-uniformity map and the plurality of original images.

15. A non-transitory medium storing a program of executable instructions causing a computer to execute:
a step of creating a static magnetic field non-uniformity map showing phase rotation or frequency shift due to static magnetic field non-uniformity, from a plurality of original images, for each of the time-series imagings;
a step of correcting discontinuity of a phase or a frequency in a spatial direction for the static magnetic field non-uniformity map obtained for each of the time-series imagings;
a step of comparing an offset of a phase or a frequency in a time-series direction with a predetermined threshold value for the static magnetic field non-uniformity map obtained for each of the time-series imagings;
a step of correcting discontinuity in the time-series direction when the offset in the time-series direction is within a predetermined threshold value range; and
a step of creating a plurality of types of tissue contrast images using the corrected static magnetic field non-uniformity map and the plurality of original images.

* * * * *